(12) United States Patent
Lee et al.

(10) Patent No.: US 11,653,546 B2
(45) Date of Patent: May 16, 2023

(54) DISPLAY DEVICE HAVING A BENT PORTION

(71) Applicant: SAMSUNG DISPLAY CO., LTD., Yongin-si (KR)

(72) Inventors: Sunhee Lee, Yongin-si (KR); Sunho Kim, Yongin-si (KR); Gunhee Kim, Yongin-si (KR); Donghwan Shim, Yongin-si (KR); Taehoon Yang, Yongin-si (KR); Choelmin Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/135,040

(22) Filed: Dec. 28, 2020

(65) Prior Publication Data

US 2021/0280642 A1   Sep. 9, 2021

(30) Foreign Application Priority Data

Mar. 5, 2020 (KR) ........................ 10-2020-0027979

(51) Int. Cl.
*G09G 5/00* (2006.01)
*H01L 27/32* (2006.01)
*H01L 51/52* (2006.01)

(52) U.S. Cl.
CPC ........ *H01L 27/323* (2013.01); *H01L 51/5253* (2013.01)

(58) Field of Classification Search
CPC .... G06F 3/0412; G06F 3/0446; G06F 3/0445; G06F 2203/04112; G06F 2203/04107;
(Continued)

(56) References Cited

U.S. PATENT DOCUMENTS 10,418,424 B2   9/2019  Oh et al.
2013/0334511 A1* 12/2013 Savas ..................... H01L 51/56
257/432
(Continued)

FOREIGN PATENT DOCUMENTS

KR         10-1470493          12/2014
KR       10-2018-0014398        2/2018
(Continued)

*Primary Examiner* — Jennifer T Nguyen
(74) *Attorney, Agent, or Firm* — F. Chau & Associates, LLC

(57) ABSTRACT

A display device includes a display area and a peripheral area. A display layer includes a plurality of display elements arranged thereon. A thin-film encapsulation layer is arranged on the display layer and includes first, second, and third encapsulation layers. The second encapsulation layer is on the first encapsulation layer. The third encapsulation layer is on the second encapsulation layer. A touch sensing layer is arranged on the thin-film encapsulation layer and includes touch electrodes and trace lines. The display area is partially bent about an axis, and the third encapsulation layer is bent along the axis and has a structure in which a first layer and a second layer are alternately stacked. The first layer includes an inorganic insulating material, and the second layer includes a silicon carbon compound material.

29 Claims, 28 Drawing Sheets

(58) Field of Classification Search
CPC ....... G06F 2203/04102; H01L 27/3276; H01L 51/5237; H01L 51/5253; H01L 27/323
USPC .................................................. 345/76, 173
See application file for complete search history.

(56) References Cited

U.S. PATENT DOCUMENTS

| | | | |
|---|---|---|---|
| 2017/0117346 A1* | 4/2017 | Kim | H01L 23/49555 |
| 2018/0033830 A1 | 2/2018 | Kim et al. | |
| 2018/0033831 A1* | 2/2018 | An | G06F 3/044 |
| 2018/0123086 A1* | 5/2018 | Oh | H01L 27/3248 |
| 2018/0166652 A1* | 6/2018 | Kim | B32B 27/308 |
| 2020/0185648 A1* | 6/2020 | Choi | H01L 51/5256 |
| 2020/0209916 A1* | 7/2020 | Zhang | G06F 1/1652 |
| 2021/0064172 A1* | 3/2021 | Lee | G06F 3/04164 |
| 2021/0151513 A1* | 5/2021 | Lee | G06F 3/0412 |

FOREIGN PATENT DOCUMENTS

| | | |
|---|---|---|
| KR | 10-2018-0025022 | 3/2018 |
| KR | 10-2018-0096853 | 8/2018 |
| KR | 10-2019-0076384 | 7/2019 |

* cited by examiner

DISPLAY DEVICE HAVING A BENT PORTION

CROSS-REFERENCE TO RELATED APPLICATION

This application claims the benefit of Korean Patent Application No. 10-2020-0027979, filed on Mar. 5, 2020, in the Korean Intellectual Property Office, the disclosure of which is incorporated herein in its entirety by reference.

TECHNICAL FIELD

The present disclosure relates to a display device, and more particularly, to a display device in which a portion of a display area is bent.

DISCUSSION OF THE RELATED ART

Unlike a liquid crystal display (LCD) device that requires the use of a separate light source, such as a backlight device, an organic light-emitting diode (OLED) display device is self-luminous and therefore can display an image without the use of a separate light source. Therefore, because a separate light source is not required, a thickness and weight of the OLED display device may be reduced, as compared to that of an LCD. In addition, an organic light-emitting diode display device has other desirable characteristics such as low power consumption, high brightness, and high respond speeds, as compared to many LCDs.

SUMMARY

A display device includes a display area and a peripheral area. The peripheral area at least partially surrounds the display area. The display device includes a display layer including a plurality of display elements arranged within the display area. A thin-film encapsulation layer is disposed on the display layer and includes a first encapsulation layer, a second encapsulation layer disposed on the first encapsulation layer, a third encapsulation layer disposed on the second encapsulation layer, and a touch sensing layer disposed on the thin-film encapsulation layer and including touch electrodes and trace lines. The display area is at least partially bent, and the third encapsulation layer is bent along the bending of the display area and has a structure in which a first layer and a second layer are alternately stacked. The first layer includes an inorganic insulating material, and the second layer includes a silicon carbon compound material.

A thickness of the second layer may be greater than a thickness of the first layer.

The second layer may include silicon oxycarbide ($SiOC_y$) or silicon oxide ($SiO_xC_yH_z$) containing carbon and hydrogen.

The first layer may include an inorganic insulating material including silicon.

The first layer may include silicon nitride, silicon oxide, or silicon oxynitride.

An edge of the first layer may extend further toward the peripheral area than an edge of the second layer extends toward the peripheral area.

The touch sensing layer may include a conductive layer including at least one of the touch electrodes or the trace lines, a first touch insulating layer disposed between the thin-film encapsulation and the conductive layer, and a second touch insulating layer covering the conductive layer and including an organic material.

The first touch insulating layer may include an organic insulating material or a silicon carbon compound material.

The display device may further include an auxiliary layer arranged on a bottom surface of the conductive layer facing the first touch insulating layer, the auxiliary layer including an inorganic insulating material.

The touch sensing layer may further include a second conductive layer disposed between the first touch insulating layer and the second touch insulating layer, and a third touch insulating layer disposed between the conductive layer and the second conductive layer.

The third touch insulating layer may include a layer including an inorganic insulating material and a layer including a silicon carbon compound material.

A thickness of the layer including the silicon carbon compound material may be greater than a thickness of the layer including the inorganic insulating material.

The peripheral area may include a bent area, and the first touch insulating layer may cover the bent area.

Each of the trace lines may include an inner portion, an outer portion, and a connection portion. The inner portion and the outer portion may be respectively arranged on two opposite sides of the bent area with the bent area disposed therebetween. The connection portion may be connected to both the inner portion and the outer portion through contact holes and the connection portion may connect the inner portion to the outer portion.

The display area may include a main display area, a plurality of lateral display areas, and a plurality of edge display areas. The plurality of lateral display areas may constitute an image surface that is different from the main display area. The plurality of edge display areas may connect the main display area to the plurality of lateral display areas.

A display device includes a display area and a peripheral area. The peripheral area at least partially surrounds the display area. The display device includes a display layer including a plurality of display elements in the display area, a thin-film encapsulation layer disposed on the display layer and including a first encapsulation layer, a second encapsulation layer disposed on the first encapsulation layer, a third encapsulation layer disposed on the second encapsulation layer, and a touch sensing layer disposed on the thin-film encapsulation layer and including a conductive layer and a touch insulating layer. The conductive layer includes at least one of touch electrodes or trace lines. The display area is at least partially bent. At least one of the first encapsulation layer, the third encapsulation layer, or the touch insulating layer is bent along the bending of the display area and includes a silicon carbon compound material.

The second encapsulation layer may include an organic insulating material, and at least one of the first encapsulation layer or the third encapsulation layer may have a structure in which a first layer and a second layer are alternately stacked. The first layer may include an inorganic insulating material that includes silicon, and the second layer may include a silicon carbon compound material.

A thickness of the second layer may be greater than a thickness of the first layer.

The first layer may include silicon nitride, silicon oxide, or silicon oxynitride, and the second layer may include silicon oxycarbide ($SiOC_y$) or silicon oxide ($SiO_xC_yH_z$) containing carbon and hydrogen.

The peripheral area may include a bent area and a pad, the pad being spaced apart from the display area with the bent area disposed therebetween, and an edge of the thin-film encapsulation layer may be between the display area and the bent area.

An edge of the first layer may extend further toward the peripheral area than an edge of the second layer extends toward the peripheral area.

The touch insulating layer may include a first touch insulating layer and a second touch insulating layer. The second touch insulating layer may be disposed on the first touch insulating layer and may include an organic insulating material. The conductive layer may be disposed between the first touch insulating layer and the second touch insulating layer.

The first touch insulating layer may include a silicon carbon compound material and the display device may further include an auxiliary layer disposed on a bottom surface of the conductive layer facing the first touch insulating layer. The auxiliary layer may contact the first touch insulating layer and the conductive layer.

The auxiliary layer may include an inorganic insulating material.

The touch sensing layer may further include a second conductive layer disposed between the first touch insulating layer and the second touch insulating layer, and a third touch insulating layer disposed between the conductive layer and the second conductive layer.

At least one of the first touch insulating layer or the third touch insulating layer may include a silicon carbon compound material.

The third touch insulating layer may include a layer including an inorganic insulating material and a layer including a silicon carbon compound material.

The peripheral area may include a bent area and at least one of the first touch insulating layer or the second touch insulating layer may extend to the bent area.

Each of the trace lines may include an inner portion, an outer portion, and a connection portion, the inner portion and the outer portion being respectively arranged on two opposite sides of the bent area with the bent area disposed therebetween. The connection portion may be connected to both the inner portion and the outer portion through contact holes and may connect the inner portion to the outer portion.

A display device includes a display area that is bent about a bending axis and a peripheral area at least partially surrounding the display area. A thin-film encapsulation layer is disposed on the display layer. A touch sensing layer is disposed on the thin-film encapsulation layer. The thin-film encapsulation layer is bent along the bending axis. The thin-film encapsulation layer includes an inorganic insulating material and a silicon carbon compound material.

BRIEF DESCRIPTION OF THE DRAWINGS

A more complete appreciation of the present disclosure and many of the attendant aspects thereof will be more apparent from the following description taken in conjunction with the accompanying drawings, in which.

DETAILED DESCRIPTION

Figure 1:
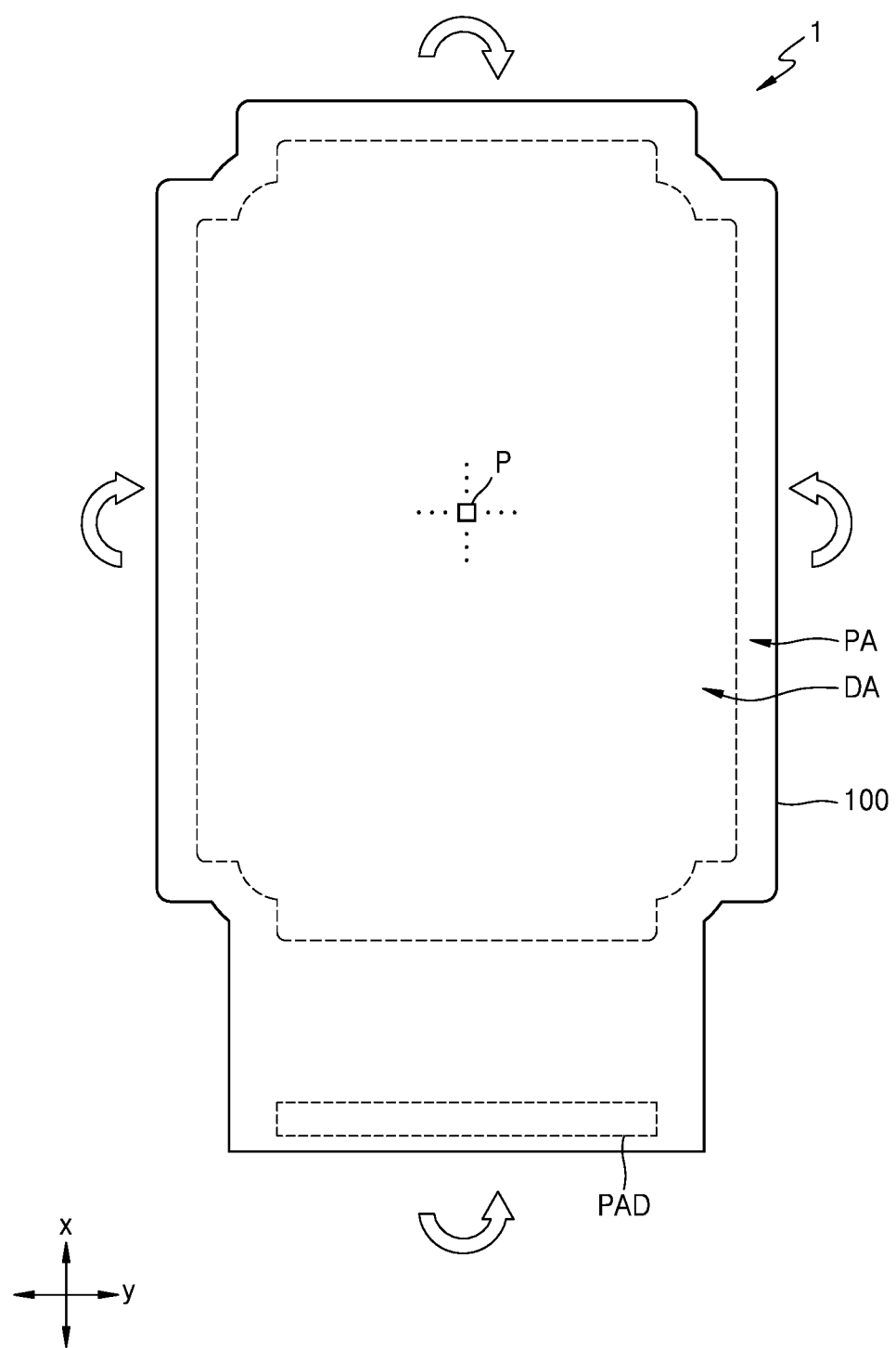
FIG. 1 is a plan view illustrating a display device according to an embodiment of the present disclosure.

Reference will now be made in detail to embodiments, examples of which are illustrated in the accompanying drawings, wherein like reference numerals refer to like elements throughout the specification and the figures. In this regard, the present embodiments may have different forms and might not necessarily be limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the present disclosure are described in detail with reference to the accompanying drawings. When description is made with reference to the drawings, like reference numerals may be used for like or corresponding elements. Thus, to the extent that a description of an element has been omitted, it may be understood that the element is at least similar to a corresponding element that is described elsewhere in the specification.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. However, the term "consisting of" used herein specifies that the presence of additional elements is precluded.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated or reduced for convenience of explanation.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

In the present specification, a term "compound material" may denote a material including two or more different elements that are chemically combined. A term "silicon compound material" may denote a material including a silicon element and one or more different elements. A term "silicon carbon compound material" may denote a material including a silicon element, a carbon element, and one or more different elements.

In the present specification, a term "ternary compound material" may denote a material essentially including three different elements. Though the term "ternary compound material" may denote a material essentially including three different elements, it should be understood that a ternary compound material may also include a trace impurity element.

In the present specification, a term "silicon carbon ternary compound material" may denote a material essentially including a silicon element, a carbon element, and an additional different element. Though the term "silicon carbon ternary compound material" may denote a material essentially including a silicon element, a carbon element, and an additional different element, a silicon carbon ternary compound material may also include a trace impurity element.

In the present specification, a term "quaternary compound material" may denote a material essentially including four different elements. Though the term "quaternary compound material" may denote a material essentially including four different elements, it should be understood that a quaternary compound material may also include a trace impurity element In the present specification, a term "silicon carbon quaternary compound material" may denote a material including a silicon element, a carbon element, and two additional different elements. Though the term "silicon carbon quaternary compound material" may denote a material essentially including a silicon element, a carbon element, and two additional elements. It should be understood that a silicon carbon quaternary compound material may also include a trace impurity element.

Figure 2:
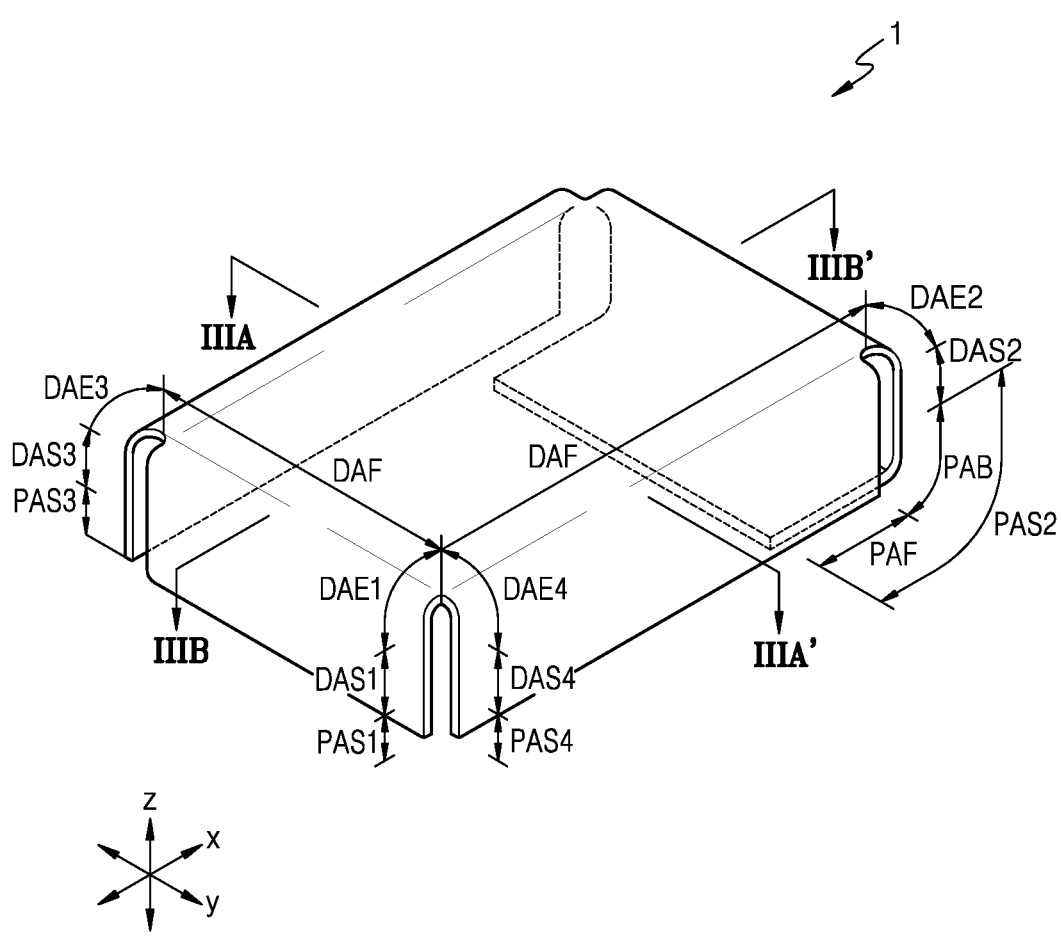
FIG. 2 is a perspective view illustrating the display device of FIG. 1.

FIG. 1 is a plan view illustrating a display device 1 according to an embodiment of the present disclosure, and FIG. 2 is a perspective view illustrating the display device 1 of FIG. 1.

As shown in FIG. 1, the display device 1 may include a display area DA and a peripheral area PA, pixels P being in the display area DA, and the peripheral area PA being outside the display area DA. The peripheral area PA may include a non-display area in which an image is not displayed. Various elements may be disposed within the non-display area such as a driver, etc. configured to provide an electrical signal or power to pixels P. The peripheral area PA may include a pad PAD, which is a region to which an electronic element or a printed circuit board, etc. may be electrically connected.

The plan view shown in FIG. 1 may include a shape of a substrate 100 included in the display device 1. For example, the substrate 100 may include a first region and a second region, the first region corresponding to the display area DA, and the second region corresponding to the peripheral area PA.

The display device 1 may be included in an electronic apparatus configured to display an image. In the display device 1, at least a portion of the display area DA may be bent and at least a portion of the peripheral area PA may be bent. For example, the display area DA of FIG. 1 may be bent around a plurality of axes, and the peripheral area PA may be bent around at least one axis. For example, it is shown in FIG. 2 that the display area DA is bent around four axes, and the peripheral area PA is bent around one axis.

Referring to FIG. 2, the display area DA may include a front display area DAF and first to fourth lateral display areas DAS1, DAS2, DAS3, and DAS4, the front display area DAF corresponding to a main display area, and the first to fourth lateral display areas DAS1, DAS2, DAS3, and DAS4 constituting image surfaces (image planes) different from that of the front display area DAF. First to fourth edge display areas DAE1, DAE2, DAE3, and DAE4 may be respectively disposed between the front display area DAF and the first to fourth lateral display areas DAS1, DAS2, DAS3, and DAS4.

The first edge display area DAE1 may connect the front display area DAF to the first lateral display area DAS1, the second edge display area DAE2 may connect the front display area DAF to the second lateral display area DAS2, the third edge display area DAE3 may connect the front display area DAF to the third lateral display area DAS3, and the fourth edge display area DAE4 may connect the front display area DAF to the fourth lateral display area DAS4.

The front display area DAF and the first to fourth lateral display areas DAS1, DAS2, DAS3, and DAS4 may each have flat image surfaces. Each of the first to fourth edge display areas DAE1, DAE2, DAE3, and DAE4 may be bent around its own axis so as to have a curvature.

Referring to FIGS. 1 and 2, the peripheral area PA may include first to fourth peripheral areas PAS1, PAS2, PAS3, and PAS4 respectively neighboring the first to fourth lateral display areas DAS1, DAS2, DAS3, and DAS4. The first peripheral area PAS1 may neighbor the first lateral display area DAS1, the second peripheral area PAS2 may neighbor the second lateral display area DAS2, the third peripheral area PAS3 may neighbor the third lateral display area DAS3, and the fourth peripheral area PAS4 may neighbor the fourth lateral display area DAS4.

The first peripheral area PAS1, the third peripheral area PAS3, and the fourth peripheral area PAS4 may be respectively disposed on the same planes as the first lateral display area DAS1, the third lateral display area DAS3, and the fourth lateral display area DAS4 that are adjacent thereto. The second peripheral area PAS2 may be bent around an axis. The second peripheral area PAS2 may include a bent area PAB and a flat area PAF. The bent area PAB may have a curvature, and the flat area PAF may include a surface that is substantially flat. The flat area PAF may at least partially overlap the front display area DAF.

Figure 3A:
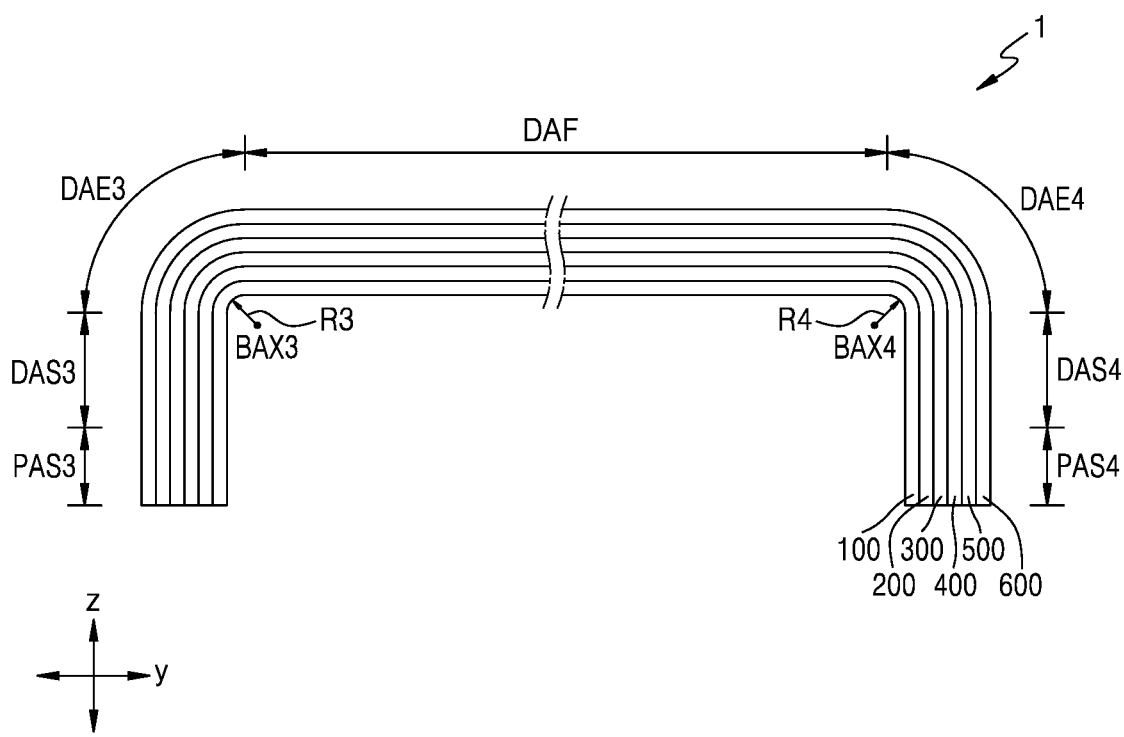
FIG. 3A is a cross-sectional view illustrating the display device taken along line IIIA-IIIA' of FIG. 2.
Figure 3B:
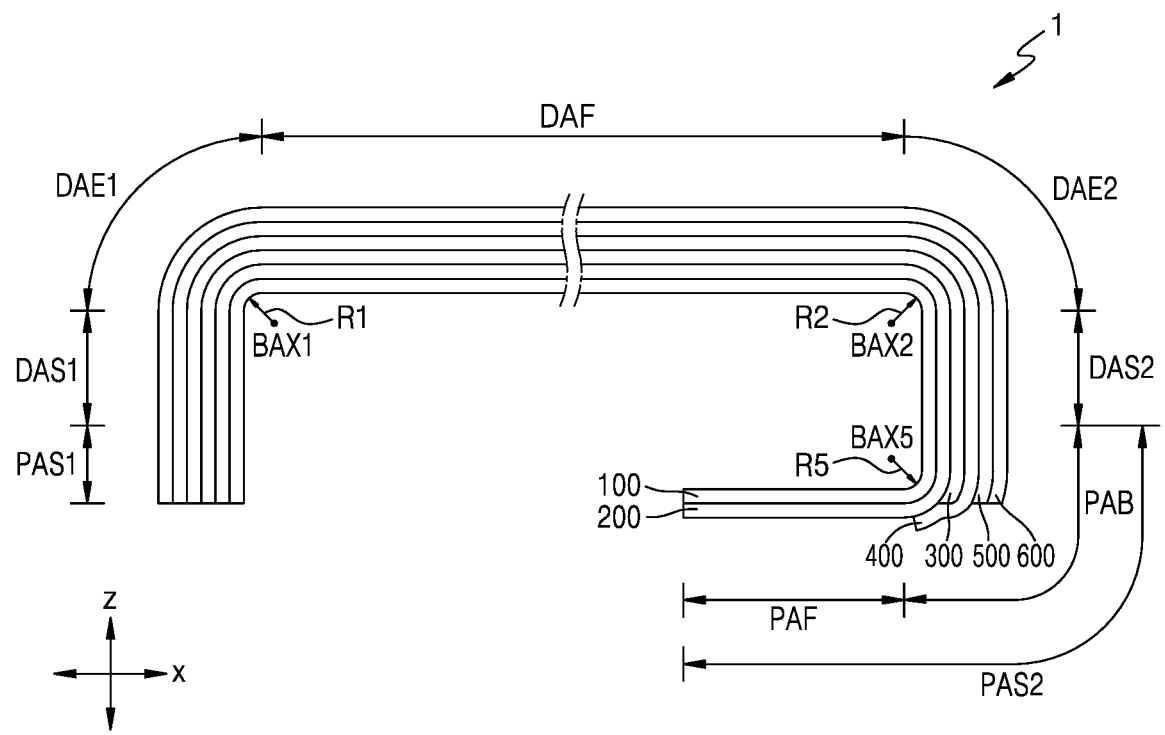
FIG. 3B is a cross-sectional view illustrating the display device taken along line IIIB-IIIB' of FIG. 2.

FIG. 3A is a cross-sectional view illustrating the display device 1 taken along line IIIA-IIIA' of FIG. 2, and FIG. 3B is a cross-sectional view illustrating the display device 1 taken along line IIIB-IIIB' of FIG. 2.

Referring to FIGS. 3A and 3B, the display device 1 may include the substrate 100 and a display layer 200, the display layer 200 being disposed on the substrate 100 and defining a plurality of pixels. The display layer 200 may include display elements and a transistor(s) and a capacitor(s), the transistor(s) and the capacitor(s) being connected to each display element.

A thin-film encapsulation layer 300 may cover the plurality of pixels over the display layer 200. The thin-film encapsulation layer 300 may prevent the display layer 200 from being damaged by foreign substances such as moisture.

A touch sensing layer 400 may be arranged on the thin-film encapsulation layer 300. The touch sensing layer 400 may be configured to obtain coordinate information corresponding to an external input, for example, a touch event of a finger, a stylus or the like. The touch sensing layer 400 may include a sensing electrode (or a touch electrode) and trace lines, the trace lines being connected to the touch electrode. The touch sensing layer 400 may be configured to sense an external input by using a mutual capacitive method or a self capacitive method.

An optical functional layer 500 may include a reflection prevention layer. The reflection prevention layer may reduce reflectivity of light (e.g. external light) incident toward the display layer 200 from the outside through a window 600. The reflection prevention layer may include a retarder and a polarizer. The retarder may include a film-type retarder or a liquid crystal-type retarder. The retarder may include a half-wave plate $\lambda/2$ retarder and/or a quarter-wave plate $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement.

In an embodiment of the present disclosure, the reflection prevention layer may include a structure including a black matrix and one or more color filters. The color filters may be arranged by taking into account colors of light emitted from pixels. For example, red color filters may be configured to filter the light of red pixels, blue color filters may be configured to filter the light of blue pixels, and green color filters may be configured to filter the light of green pixels. In an embodiment of the present disclosure, the reflection prevention layer may include a destructive interference structure. The destructive interference structure may include a first reflective layer and a second reflective layer arranged on different layers. First-reflected light and second-reflected light respectively reflected by the first reflective layer and the second reflective layer may be destructively interfered and thus reflectivity of external light may be reduced.

The window 600 may be arranged on the optical functional layer 500. The window 600 may include a transparent light-transmissive material, for example, light transmissive glass or resin. The window 600 may be coupled to the optical functional layer 500 through an adhesive layer including an optical clear adhesive.

Referring to FIG. 3A, the third and fourth lateral display areas DAS3 and DAS4 respectively arranged on two opposite sides of the front display area DAF may display an image in different directions from each other. The third lateral display area DAS3 and the front display area DAF may be connected to the third edge display area DAE3, and the fourth lateral display area DAS4 and the front display area DAF may be connected to the fourth edge display area DAE4.

The third edge display area DAE3 may be convexly bent toward the outside to have a third radius of curvature R3 about a third axis BAX3, and the fourth edge display area DAE4 may be convexly bent toward the outside to have a fourth radius of curvature R4 about a fourth axis BAX4. In an embodiment of the present disclosure, the third radius of curvature R3 and/or the fourth radius of curvature R4 may be about 4 mm or less. For example, the third radius of curvature R3 and/or the fourth radius of curvature R4 may be about 2 mm or less. The third radius of curvature R3 and the fourth radius of curvature R4 may the same or different from each other.

The third and fourth peripheral areas PAS3 and PAS4 may be respectively located on the same planes as the third and fourth lateral display areas DAS3 and DAS4.

Referring to FIG. 3B, the first and second lateral display areas DAS1 and DAS2 respectively arranged on two opposite sides of the front display area DAF may display an image in different directions. The first lateral display area DAS1 and the front display area DAF may be connected to the first edge display area DAE1, and the second lateral display area DAS2 and the front display area DAF may be connected to the second edge display area DAE2.

The first edge display area DAE1 may be convexly bent toward the outside to have a first radius of curvature R1 about a first axis BAX1, and the second edge display area DAE2 may be convexly bent toward the outside to have a second radius of curvature R2 about a second axis BAX2. In an embodiment of the present disclosure, the first radius of curvature R1 and/or the second radius of curvature R2 may be about 4 mm or less. For example, the first radius of curvature R1 and/or the second radius of curvature R2 may be about 2 mm or less. The first to fourth radii of curvatures R1, R2, R3, and R4 may be the same or different from one another.

The first peripheral area PAS1 may be located on the same plane as the first lateral display area DAS1. A portion of the second peripheral area PAS2, for example, the bent area PAB may be convexly bent to have a fifth radius of curvature R5 about a fifth axis BAX5. In an embodiment of the present disclosure, the fifth radius of curvature R5 may be about 4 mm or less. For example, the fifth radius of curvature R5 may be about 2 mm or less.

The flat area PAF of the second peripheral area PAS2 may at least partially overlap the front display area DAF while being spaced apart from the front display area DAF by a predetermined interval. A portion or all of the flat area PAF might not overlap the thin-film encapsulation layer 300, the touch sensing layer 400, the optical functional layer 500, and the window 600. Edges of the thin-film encapsulation layer 300, the touch sensing layer 400, the optical functional layer 500, and the window 600 may be between the flat area PAF and the bent area PAB. In an embodiment of the present disclosure, the touch sensing layer 400 may extend further toward the flat area PAF to cover the bent area PAB beyond the edge of the thin-film encapsulation layer 300.

The pad PAD (see FIG. 1) described with reference to FIG. 1 may be arranged in the flat area PAF. The pad PAD might not cover or might not overlap the thin-film encapsulation layer 300, the touch sensing layer 400, the optical functional layer 500, and the window 600.

The thin-film encapsulation layer 300 and/or the touch sensing layer 400 may include a silicon carbon compound material.

Because the display device 1 including the bent areas includes the plurality of layers stacked on the substrate 100 as described above and each layer has a predetermined thickness, stress caused by the bending may be applied to the display device 1. The bending stress may affect a layer arranged away from the substrate 100 in a radial direction away from an axis, the layer including the thin-film encapsulation layer 300, the touch sensing layer 400, and/or the optical functional layer 500. The thin-film encapsulation layer 300 and/or the touch sensing layer 400 may be deposited on the substrate 100 without an adhesive layer interposed therebetween. In this case, the thin-film encapsulation layer 300 and/or the touch sensing layer 400 may crack due to the bending stress. The structure may be more prone to cracks as the radii of curvature of the first to fourth edge display areas DAE1, DAE2, DAE3, and DAE4 are smaller. In contrast, as described below, in an embodiment of the present disclosure, because the thin-film encapsulation layer 300 and/or the touch sensing layer 400 include a silicon carbon compound material, the cracking issue may be prevented or minimized.

According to one simplified embodiment of the present disclosure, the display device having a display area and a peripheral area may include a thin-film encapsulation layer on the display area and a touch sensing layer on the thin-film encapsulation layer. The display area may be bent along a bending axis. The encapsulation layer may be bent along the bending axis of the display area. The encapsulation layer may include an inorganic layer and a silicon carbon layer.

Figure 4:
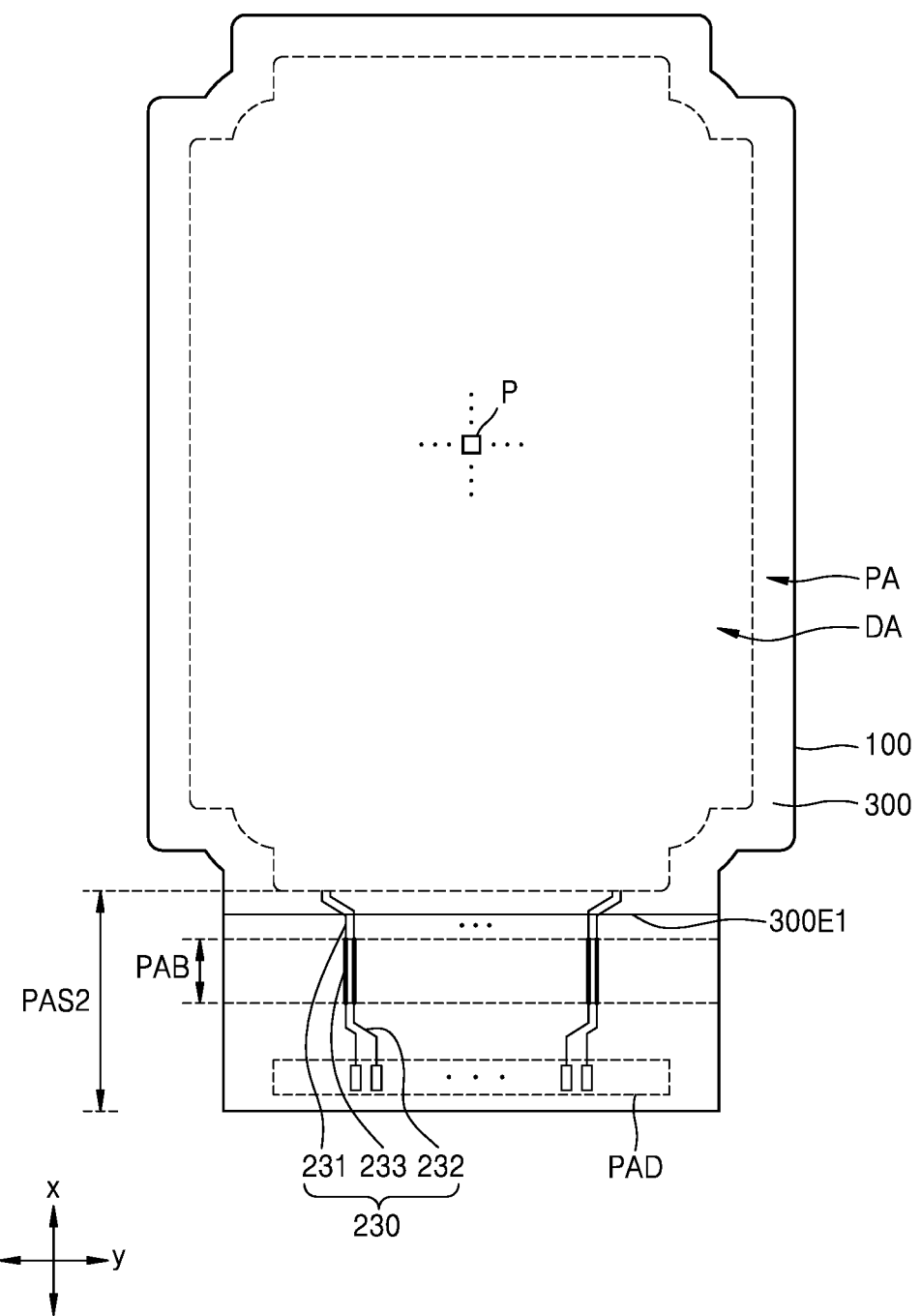
FIG. 4 is a plan view illustrating a process of manufacturing a display device according to an embodiment of the present disclosure.
Figure 5:
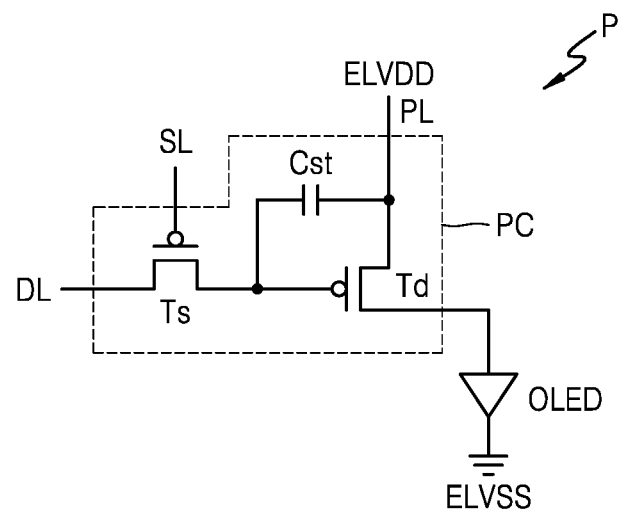
FIG. 5 is an equivalent circuit diagram illustrating a pixel of a display device.

FIG. 4 is a plan view illustrating a process of manufacturing the display device 1 according to an embodiment of the present disclosure, and FIG. 5 is an equivalent circuit diagram illustrating a pixel of the display device 1. It is shown in FIG. 4 that a display layer is formed on the substrate 100, and the thin-film encapsulation layer 300 is formed on the display layer, the display layer including a plurality of pixels P.

Referring to FIG. 4, the plurality of pixels P may be arranged in the display area DA. Each pixel P may include a display element, for example, a light-emitting diode, that may emit light of a predetermined color.

In an embodiment of the present disclosure, each pixel P may include an organic light-emitting diode OLED as shown in FIG. 5. The organic light-emitting diode OLED may emit, for example, red, green, or blue light or emit red, green, blue, or white light. Each organic light-emitting diode OLED may be electrically connected to a pixel circuit PC.

The pixel circuit PC may include a driving thin film transistor Td, a switching thin film transistor Ts, and a storage capacitor Cst.

The switching thin film transistor Ts may be connected to a scan line SL and a data line DL and configured to transfer a data voltage input from the data line DL to the driving thin film transistor Td in response to a switching voltage input from the scan line SL. The storage capacitor Cst may be connected to the switching thin film transistor Ts and a driving voltage line PL and configured to store a voltage corresponding to a difference between a voltage transferred from the switching thin film transistor Ts and a first power voltage ELVDD supplied through the driving voltage line PL.

The driving thin film transistor Td may be connected to the driving voltage line PL and the storage capacitor Cst and configured to control a driving current flowing through the organic light-emitting diode OLED from the driving voltage line PL in response to a voltage stored in the storage capacitor Cst. The organic light-emitting diode OLED may emit light having a predetermined brightness according to the driving current. An opposite electrode (e.g. a cathode) of the organic light-emitting diode OLED may receive a second power voltage ELVSS.

Though it is shown in FIG. 5 that the pixel circuit PC includes two thin film transistors and one storage capacitor, the number of thin film transistors or the number of storage capacitors may be variously changed depending on the design of the pixel circuit PC.

The display layer may include lines configured to provide a signal or a voltage to the pixels P. In an embodiment of the present disclosure, FIG. 4 shows lines 230 extending from the peripheral area PA to the pad PAD, the lines 230 being configured to provide a signal (e.g. a data signal) to the pixels P. In a portion of the peripheral area PA, for example, the second peripheral area PAS2, the lines 230 may extend across the bent area PAB.

The lines 230 may include an inner line portion 231, an outer line portion 232, and a connection line portion 233, the inner line portion 231 and the outer line portion 232 being spaced apart from each other with the bent area PAB therebetween, and the connection line portion 233 connecting the inner line portion 231 to the outer line portion 232. The connection line portion 233 may be connected to the inner line portion 231 and the outer line portion 232 through contact holes.

The connection line portion 233 may include a flexible conductive material. Therefore, as described above with reference to FIG. 2, the connection line portion 233 may prevent the lines 230 from being damaged by stress caused in the case where the bent area PAB is bent. The conductive material may be flexible and may include, for example, aluminum, etc. As used herein, the term "flexible" means able to be bent to a non-trivial degree without cracking. A non-trivial degree of bending is understood to be more than about 10 degrees.

The thin-film encapsulation layer 300 may have an area that is greater than the display area DA so as to entirely cover the display area DA. The thin-film encapsulation layer 300 might not cover a portion of the peripheral area PA, for example, the bent area PAB. For example, it is shown in FIG. 4 that a first edge 300E1 of the thin-film encapsulation layer 300 that neighbors the pad PAD is between the bent area PAB and the display area DA.

Figure 6:
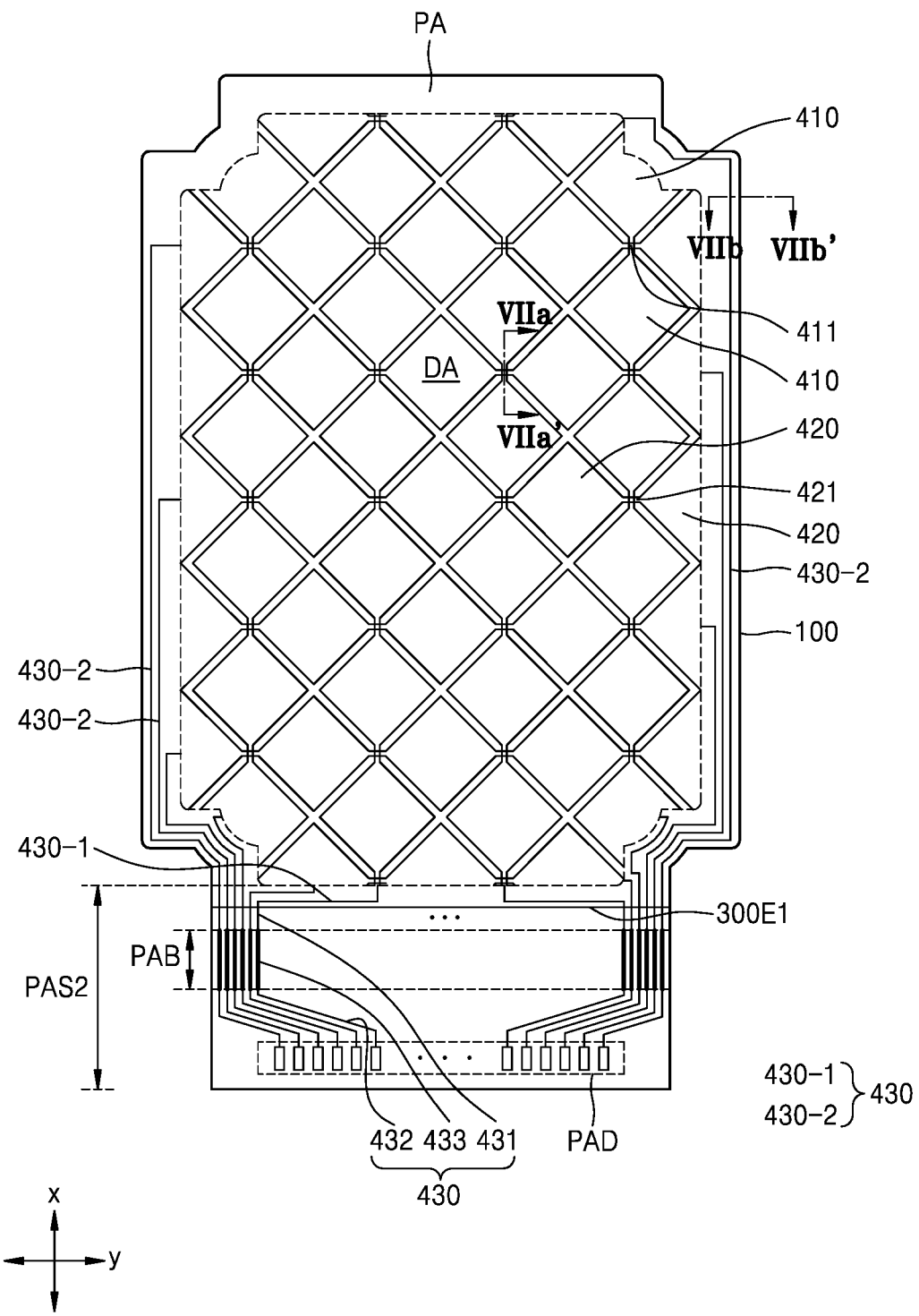
FIG. 6 is a plan view illustrating a process of manufacturing a display device according to an embodiment of the present disclosure.

FIG. 6 is a plan view illustrating a process of manufacturing the display device 1 according to an embodiment of the present disclosure and shows that the touch sensing layer is formed on the thin-film encapsulation layer 300 of FIG. 4.

Referring to FIG. 6, the touch sensing layer may include first touch electrodes 410, second touch electrodes 420, and trace lines 430, the first touch electrodes 410 and the second touch electrodes 420 being located in the display area DA, and the trace lines 430 being located in the peripheral area PA.

The first touch electrodes 410 may be arranged in a first direction (e.g. an x-direction of FIG. 6), and the second touch electrodes 420 may be arranged in a second direction (e.g. a y-direction of FIG. 6) intersecting with the first direction. The first touch electrodes 410 arranged in the first direction may be connected to each other by a first connection electrode 411 between neighboring first touch electrodes 410 to constitute one sensing line. A plurality of first sensing lines each extending in the first direction may be arranged in the display area DA. Each of the first sensing lines may be connected to the pad PAD through a first trace line 430-1 located in the peripheral area PA.

The second touch electrodes 420 arranged in the second direction may be connected to each other by a second connection electrode 421 between neighboring second touch electrodes 420 to constitute one sensing line. A plurality of second sensing lines each extending in the second direction may be arranged in the display area DA. The plurality of second sensing lines may intersect with the plurality of first sensing lines. Each of the second sensing lines may be connected to the pad PAD through a second trace line 430-2 located in the peripheral area PA.

The trace lines 430, for example, the first trace lines 430-1 and the second trace lines 430-2, may extend across the bent area PAB in the second peripheral area PAS2. Each of the trace lines 430 may include an inner portion 431, an outer portion 432, and a connection portion 433, the inner portion 431 and the outer portion 432 being spaced apart from each other with the bent area PAB therebetween, and the connection portion 433 connecting the inner portion 431 to the outer portion 432.

The connection portion 433 may be connected to the inner portion 431 and the outer portion 432 through contact holes. The connection portion 433 may include a flexible conductive material. Therefore, as described above with reference to FIG. 2, the connection portion 433 may prevent the trace lines 430 from being damaged by stress caused in the case where the bent area PAB is bent. The flexible conductive material may include, for example, aluminum, etc.

Figure 7:
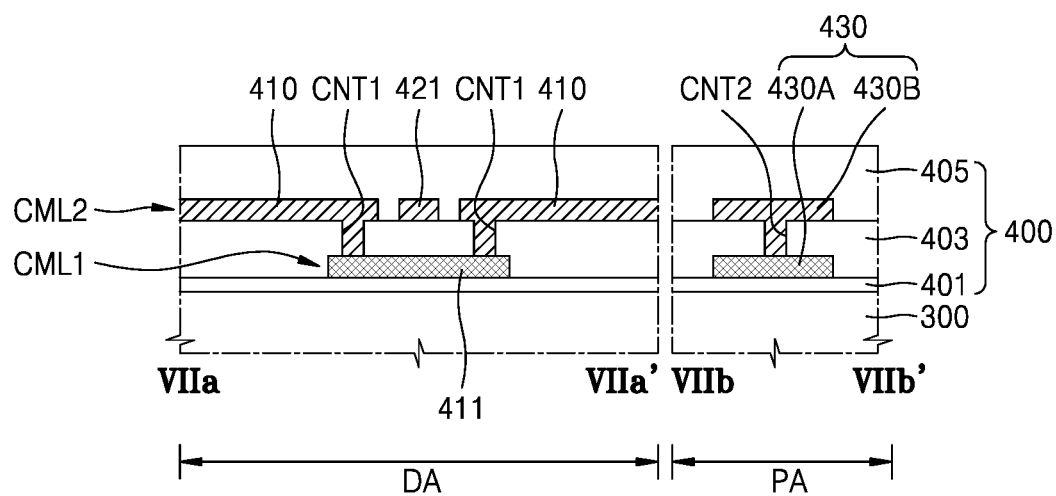
FIG. 7 is a cross-sectional view illustrating a touch sensing layer taken along lines VIIa-VIIa' and VIIb-VIIb' of FIG. 6.
Figure 8A:
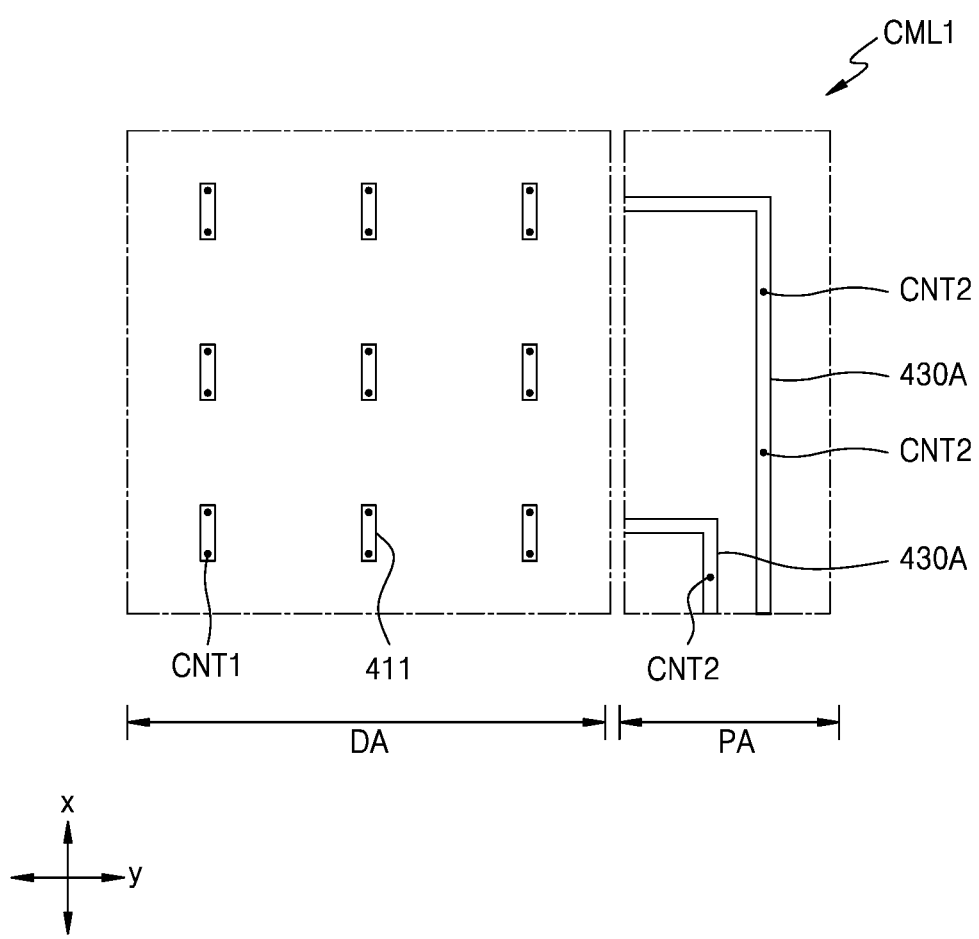
FIG. 8A is a plan view illustrating a portion of a first conductive layer of a touch sensing layer.
Figure 8B:
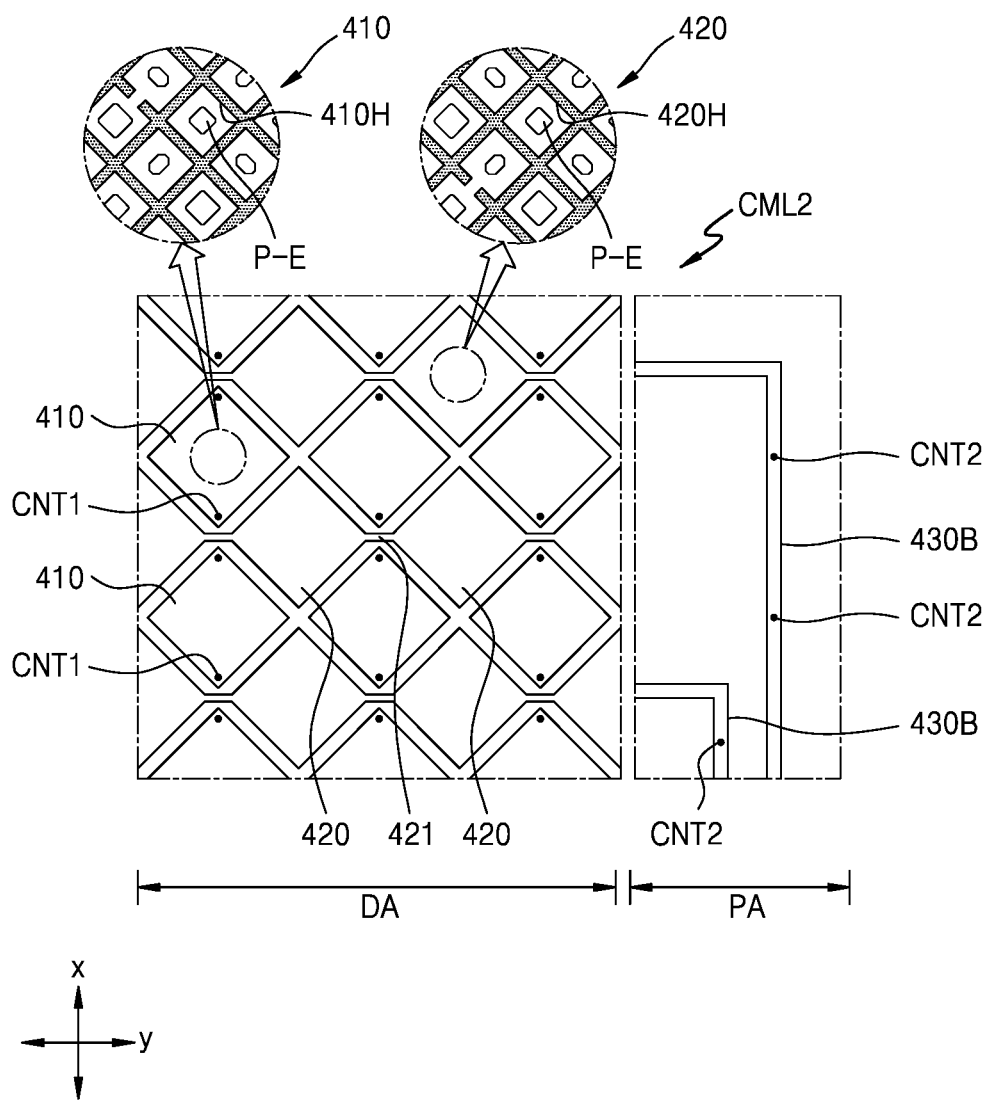
FIG. 8B is a plan view illustrating a portion of a second conductive layer of a touch sensing layer.

FIG. 7 is a cross-sectional view illustrating the touch sensing layer 400 taken along lines VIIa-VIIa' and VIIb-VIIb' of FIG. 6, FIG. 8A is a plan view illustrating a portion of a first conductive layer of the touch sensing layer 400, and FIG. 8B is a plan view illustrating a portion of a second conductive layer of the touch sensing layer 400.

Referring to FIG. 7, the touch sensing layer 400 may include the first touch electrode 410, the second touch electrode 420, the first connection electrode 411, the second connection electrode 421 in the display area DA, and the trace lines 430 in the peripheral area PA. The trace lines 430 may include a plurality of layers. The trace lines 430 may include a first sub-trace line 430A and a second sub-trace line 430B located on different layers.

The touch sensing layer 400 may be located on the thin-film encapsulation layer 300 and may include a plurality of conductive layers. For example, the touch sensing layer 400 may include a first conductive layer CML1 and a second conductive layer CML2. A first touch insulating layer 401 may be arranged between the first conductive layer CML1 and the thin-film encapsulation layer 300. A second touch insulating layer 403 may be arranged between the first conductive layer CML1 and the second conductive layer CML2. A third touch insulating layer 405 may be located on the second conductive layer CML2.

As shown in FIGS. 7 and 8A, the first conductive layer CML1 may include the first connection electrode 411 located in the display area DA. As shown in FIGS. 7 and 8B, the second conductive layer CML2 may include the first touch electrodes 410, the second touch electrodes 420, and the second connection electrodes 421 located in the display area DA. The second touch electrodes 420 may be connected to each other by the second connection electrodes 421 arranged on the same layer as the second touch electrodes 420. The first touch electrodes 410 may be connected to each other by the first connection electrodes 411 arranged on a layer different from the first touch electrodes 410. The first connection electrodes 411 electrically connecting the first touch electrodes 410 that neighbor each other may be connected to the neighboring first touch electrodes 410 through a first contact hole CNT1 formed in the second touch insulating layer 403.

As shown in FIGS. 7 and 8A, the first conductive layer CML1 may include first sub-trace layers 430A located in the peripheral area PA. As shown in FIGS. 7 and 8B, the second conductive layer CML2 may include second sub-trace layers 430B located in the peripheral area PA. The first sub-trace layer 430A may be connected to the second sub-trace layer 430B through a second contact hole CNT2 formed in the second touch insulating layer 403.

The first conductive layer CML1 and the second conductive layer CML2 each may include metal. For example, the first conductive layer CML1 and the second conductive layer CML2 may include molybdenum (Mo), aluminum (Al), copper (Cu), and/or titanium (Ti). The first conductive layer CML1 and the second conductive layer CML2 may include a single layer or a multi-layer including the above materials. In an embodiment of the present disclosure, the first conductive layer CML1 and the second conductive layer CML2 each may have a structure in which a titanium layer, an aluminum layer, and a titanium layer are sequentially stacked (Ti/Al/Ti).

Referring to an enlarged view illustrating FIG. 8B, the first touch electrode 410 may have a mesh structure (or a grid structure or a lattice structure) including a plurality of holes 410H. The holes 410H may at least partially overlap an emission area P-E of a pixel. Portions of the first touch electrode 410 may be connected to each other to have a mesh structure and may define the holes 410H. The holes 410H may be spatially separated from each other with the portions of the first touch electrode 410 therebetween. The holes 410H that neighbor each other among the plurality of holes 410H may be spatially connected to each other.

Similarly, the second touch electrode 420 may have a grid structure (or a lattice structure) including a plurality of holes 420H. The holes 420H may at least partially overlap an emission area P-E of a pixel. Portions of the second touch electrode 420 may be connected to each other to have a mesh structure and may define the holes 420H. The holes 420H may be spatially separated from each other with the portions of the second touch electrode 420 therebetween. The holes 420H that neighbor each other among the plurality of holes 420H may be spatially connected to each other.

Though it is shown in FIGS. 7 to 8B that the first touch electrode 410 and the first connection electrode 411 are arranged on different layers, the embodiment is not necessarily limited thereto. For example, the first touch electrodes 410 and the first connection electrodes 411 may be arranged on the same layer (e.g. the first conductive layer or the second conductive layer).

The second touch electrodes 420 and the second connection electrode 421 may be arranged on different layers and connected to each other through contact holes passing through the second touch insulating layer 403.

Though it is shown in FIGS. 7 to 8B that the first and second touch electrodes 410 and 420 are included in the second conductive layer CML2, the embodiment is not necessarily limited thereto. For example, the first touch electrode 410 and the second touch electrode 420 may be provided (included) in different layers. For example, one of the first touch electrode 410 and the second touch electrode 420 may be provided in the first conductive layer CML1, and the other may be provided in the second conductive layer CML2.

Figure 9:
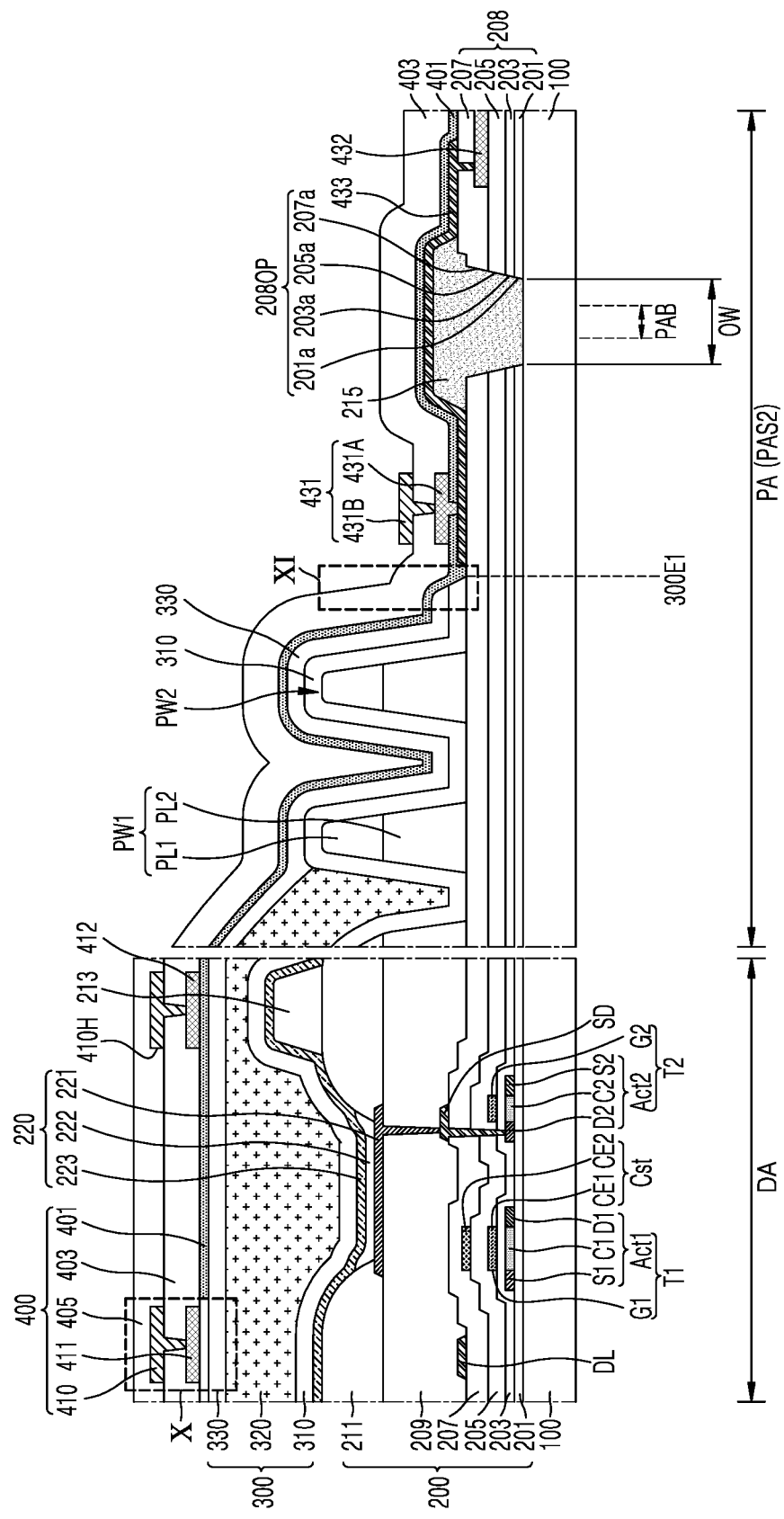
FIG. 9 is a cross-sectional view illustrating a display device according to an embodiment of the present disclosure.

FIG. 9 is a cross-sectional view illustrating the display device 1 according to an embodiment of the present disclosure, FIGS. 10A to 10D are enlarged cross-sectional views of a region X of FIG. 9, and FIGS. 11A to 11D are enlarged cross-sectional views of a region XI of FIG. 9.

First, the display area DA of FIG. 9 is described.

The substrate 100 may include a polymer. For example, the substrate 100 may include a polymer resin such as polyethersulfone, polyarylate, polyacrylate, polyetherimide, polyethylene naphthalate, polyethylene terephthalate, polyphenylene sulfide, polyimide, polycarbonate, cellulose tri acetate, and/or cellulose acetate propionate. The substrate 100 may include a single layer or a multi-layer including the above materials. In an embodiment of the present disclosure, the substrate 100 may have a structure in which a base layer and an inorganic insulating layer are alternately stacked, the base layer including the above material, and the inorganic insulating layer including silicon nitride, silicon oxynitride, and/or silicon oxide. For example, the substrate 100 may have a structure in which the base layer/the inorganic insulating layer/the base layer/the inorganic insulating layer that are stacked.

A buffer layer 201, a gate insulating layer 203, a first interlayer insulating layer 205, a second interlayer insulating layer 207, and a planarization insulating layer 209 may be arranged on the substrate 100, the buffer layer 201 being configured to prevent impurities from penetrating into a semiconductor layer of a thin film transistor TFT, the gate insulating layer 203 being configured to insulate semiconductor layers of a first or second thin film transistor T1 or T2 from a gate electrode, the first interlayer insulating layer 205 being between a first electrode CE1 and a second electrode CE2 of a storage capacitor Cst, the second interlayer insulating layer 207 being configured to insulate a source electrode or a drain electrode of the first or second thin film transistor T1 or T2 from the gate electrode, and the planarization insulating layer 209 covering the thin film transistor TFT.

The buffer layer 201, the gate insulating layer 203, the first interlayer insulating layer 205, and the second interlayer insulating layer 207 may include an inorganic insulating material such as silicon nitride, silicon oxynitride, and/or silicon oxide. The planarization insulating layer 209 may include a layer having an approximately flat top surface and include an organic insulating material such as benzocyclobutene (BCB), polyimide, or hexamethyldisiloxane (HMDSO).

The display layer 200 may include an organic light-emitting diode 220, the organic light-emitting diode 220 being electrically connected to thin film transistors, for example, the first and second thin film transistors T1 and T2 and the storage capacitor Cst formed between the above-described insulating layers. The display layer 200 of FIG. 9 corresponds to a cross-sectional view illustrating a pixel circuit according to an embodiment of the present disclosure including a greater number of transistors than the number of transistors included in the pixel circuit described above with reference to FIG. 4. The first thin film transistor T1 of FIG. 9 may correspond to a driving thin film transistor, and the second thin film transistor T2 may correspond to a control transistor configured to operate in response to a control signal for an operation of the organic light-emitting diode 220. In the drawing of FIG. 9, a switching thin film transistor is omitted.

The first thin film transistor T1 may include a first semiconductor layer Act1 and a first gate electrode G1, and the second thin film transistor T2 may include a second semiconductor layer Act2 and a second gate electrode G2.

The first semiconductor layer Act1 and the second semiconductor layer Act2 may include amorphous silicon, polycrystalline silicon, an oxide semiconductor, or an organic semiconductor material. The first semiconductor layer Act1 may include a channel region C1, a source region S1, and a drain region D1, the source region S1 and the drain region D1 being arranged on two opposite sides of the channel region C1. The second semiconductor layer Act2 may include a channel region C2, a source region S2, and a drain region D2, the source region S2 and the drain region D2 being arranged on two opposite sides of the channel region C2.

The first and second gate electrodes G1 and G2 may include a low-resistance conductive material such as molybdenum (Mo), aluminum (Al), copper (Cu), and/or titanium (Ti) and include a single layer or a multi-layer including the above materials. The first gate electrode G1 and the second gate electrode G2 may be arranged on the same layer or arranged on different layers.

The second thin film transistor T2 may include a source electrode (not shown) and/or a drain electrode SD. In an embodiment of the present disclosure, FIG. 9 shows the drain electrode SD. The drain electrode SD may be arranged on the same layer as a data line DL and may include the same material as the data line DL. The drain electrode SD and the data line DL may have a single-layered structure or a multi-layered structure including a conductive material having an excellent conductivity. For example, the drain electrode SD and the data line DL may have a single-layered structure or a multi-layered structure including a conductive material including aluminum (Al), copper (Cu), and/or titanium (Ti). In an embodiment of the present disclosure, the drain electrode SD and the data line DL may have a three-layered structure of a titanium layer/an aluminum layer/a titanium layer.

FIG. 9 shows that the first and second thin film transistors T1 and T2 respectively include top-gate type thin film transistors in which the first and second gate electrodes G1 and G2 of the first and second thin film transistors T1 and T2 are respectively arranged over the first and second semiconductor layers Act1 and Act2. For example, the first and second thin film transistors T1 and T2 may respectively include bottom-gate type thin film transistors in which the first and second gate electrodes G and G2 of the first and second thin film transistors T1 and T2 are respectively arranged below the first and second semiconductor layers Act1 and Act2.

The storage capacitor Cst may at least partially overlap the first thin film transistor T1. In this case, the areas of the storage capacitor Cst and the first thin film transistor T1 may be increased and a high-quality image may be provided. For example, the first gate electrode G1 may serve as the first electrode CE of the storage capacitor Cst. For example, the storage capacitor Cst might not overlap the first thin film transistor T1.

The organic light-emitting diode 220 of the display layer 200 may include a pixel electrode 221, an emission layer 222, and an opposite electrode 223.

The pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 221 may include the reflective layer and a transparent conductive layer on and/or under the reflective layer, the reflective layer including the above material. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment of the present disclosure, the pixel electrode 221 may have a multi-layered structure of an ITO layer, an Ag layer, and an ITO layer that are sequentially stacked.

A pixel-defining layer 211 is arranged on the pixel electrode 221. The pixel-defining layer 211 covers edges of the pixel electrode 221 and includes an opening that at least partially overlaps a central portion of the pixel electrode 221. The pixel-defining layer 211 may include an organic insulating material such as benzocyclobutene (BCB), polyimide, or hexamethyldisiloxane (HMDSO).

A spacer 213 may be formed on the pixel-defining layer 211. The spacer 213 may prevent layers arranged under the spacer 213 from being damaged by a mask used during a process of forming the emission layer 222 described below. The spacer 213 may include the same material as the pixel-defining layer 211.

The emission layer 222 may include, for example, an organic material. The emission layer 222 may include a polymer organic material or a low molecular weight organic material that emits light of a predetermined color (e.g. red, green, or blue color). A functional layer may be arranged on and under the emission layer 222. The functional layer may include a hole injection layer (HIL), a hole transport layer (HTL), an electron transport layer (ETL), and/or an electron injection layer (EIL).

The opposite electrode 223 may include a conductive material having a relatively small work function. For example, the opposite electrode 223 may include a (semi) transparent layer including silver (Ag), magnesium (Mg), aluminum (Al), nickel (Ni), chromium (Cr), lithium (Li), calcium (Ca), or an alloy thereof. In an embodiment of the present disclosure, the opposite electrode 223 may include silver (Ag) and magnesium (Mg). Alternatively, the opposite electrode 223 may further include a layer including a material such as ITO, IZO, ZnO, or $In_2O_3$ on the (semi) transparent layer including the above material. The opposite electrode 223 may be provided as a single body to entirely cover the display area DA.

The thin-film encapsulation layer 300 may include an organic insulating material (e.g. a polymer) and a layer including a silicon carbon compound material.

A third encapsulation layer 330 may include a silicon compound material having a multi-layered structure. As shown in FIG. 10C, the third encapsulation layer 330 may include a first layer 331 and a second layer 332 including a silicon carbon compound material.

The first layer 331 may include an inorganic insulating material including, for example, silicon. The inorganic insulating material including silicon may include silicon nitride ($SiN_x$), silicon oxide ($SiO_x$), and/or silicon oxynitride (SiON).

The second layer 332 may include a silicon carbon compound material. The silicon carbon compound material may include a silicon carbon ternary compound material or a silicon carbon quaternary compound material. The silicon carbon ternary compound material may include, for example, silicon oxycarbide ($SiOC_y$) including silicon, carbon, and oxygen. The silicon carbon quaternary compound material may include, for example, silicon, carbon, oxygen, and hydrogen.

For example, the silicon carbon quaternary compound material may include silicon oxide ($SiO_xC_yH_z$) containing carbon and hydrogen. The second layer 332 may include silicon oxycarbide ($SiOC_y$) or silicon oxide ($SiO_xC_yH_z$) containing carbon and hydrogen. These materials may have characteristics similar to those of an organic material.

Silicon oxycarbide ($SiOC_y$) may have characteristics similar to those of an inorganic layer or characteristics similar to those of an organic layer depending on the content of carbon. Silicon oxycarbide ($SiOC_y$), according to an embodiment of the present disclosure, includes a material having a relatively large content of carbon and may have characteristics similar to those of an organic layer.

Silicon oxide ($SiO_xC_yH_z$) containing carbon and hydrogen may have properties similar to those of an inorganic layer when the composition ratio of x is large and have properties similar to those of an organic layer when the composition ratio of y is large. Silicon oxide ($SiO_xC_yH_z$) containing carbon and hydrogen according to an embodiment of the present disclosure includes a material including a relatively large content of carbon and may have characteristics similar to those of an organic layer.

An elastic coefficient of the second layer 332 may be less than an elastic coefficient of the first layer 331. In an embodiment of the present disclosure, an elastic coefficient of silicon oxide ($SiO_xC_yH_z$) may be less than 10 GPa and be easily transformed and accordingly, as described with reference to FIGS. 1 and 2, even though the display area DA and/or the peripheral area PA is partially bent, the cracking issue caused by bending stress may be prevented or minimized. In an embodiment of the present disclosure, an elastic coefficient of silicon oxide ($SiO_xC_yH_z$) may be about 5 GPa to about 6 GPa, and an elastic coefficient of silicon nitride ($SiN_x$) may be about 11 GPa.

The first layer 331 and the second layer 332 may be alternately stacked and the first layer 331 may directly contact the second layer 332. The first layer 331 and the second layer 332 may be formed by changing a layer-forming gas in the same chamber. For example, the first layer 331 may be formed by using atomic layer deposition (ALD), and the second layer 332 may be formed by using chemical vapor deposition (CVD).

To prevent cracks caused by bending stress, the thickness of the second layer 332 may be greater than the thickness of the first layer 331. In an embodiment of the present disclosure, the thickness of the second layer 332 may be about 500 Å to about 2000 Å. For example, the thickness of the second layer 332 may be about 500 Å to about 1000 Å. The thickness of the first layer 331 may be about 50 Å to about 300 Å. For example, the thickness of the first layer 331 may be about 100 Å to about 200 Å.

In the case where one first layer 331 and one second layer 332 correspond to 1 dyad, the third encapsulation layer 330 may have a stacked structure of 3 dyads or more, more suitably, 3.5 dyads or more. In an embodiment of the present disclosure, it is shown in FIG. 10C that three pairs of the first layer 331 and the second layer 332 are stacked and one (e.g. the first layer 331) of the first layer 331 and the second layer 332 is stacked thereon.

It is shown in FIG. 10C that the third encapsulation layer 330 includes the first layers 331 and the second layers 332 that are alternately stacked and the first layer 331, which is a lowermost layer of the third encapsulation layer 330, contacts a second encapsulation layer 320. For example, the lowermost layer of the third encapsulation layer 330 may include the second layer 332. In this case, the second layer 332 may contact the second encapsulation layer 320.

Referring to FIG. 9 again, a first encapsulation layer 310 may be located under the second encapsulation layer 320. The first encapsulation layer 310 may include an inorganic insulating material and/or a silicon carbon compound material. A specific structure of the first encapsulation layer 310 is described below with reference to FIGS. 11A to 11C.

The second encapsulation layer 320 may include an organic material, for example, an organic insulating material. The second encapsulation layer 320 may include a polymer-based material. The polymer-based material may include an acryl-based resin, an epoxy-based resin, polyimide, and polyethylene. For example, the second encapsulation layer 320 may include an acrylic resin, for example, polymethylmethacrylate, poly acrylic acid, etc. The second encapsulation layer 320 may be formed by hardening a monomer or coating a polymer.

The touch sensing layer 400 may include a touch insulating layer and one or more conductive layers, the touch insulating layer including a first touch insulating layer 401, a second touch insulating layer 403, and a third touch insulating layer 405. In an embodiment of the present disclosure, FIG. 9 shows a first connection electrode 411 and a portion of the touch electrode 410, the first connection electrode 411 being disposed on the first touch insulating layer 401, and the touch electrode 410 being connected to the first connection electrode 411. As described with reference to FIG. 8B, the first touch electrode 410 may include a hole 410H at least partially overlapping the emission area of the organic light-emitting diode 220. Though FIG. 9 shows the first connection electrode 411 as a portion of the first conductive layer and shows the first touch electrode 410 as a portion of the second conductive layer, elements of the first conductive layer and the second conductive layer described above with reference to FIGS. 8A and 8B may be respectively located on the first touch insulating layer 401 and the second touch insulating layer 403.

The first touch insulating layer 401 may include a silicon carbon compound material. For example, the first touch insulating layer 401 may include silicon oxycarbide ($SiOC_y$) or silicon oxide ($SiO_xC_yH_z$) containing carbon and hydrogen and these materials may have characteristics similar to those of an organic material as described above.

Figure 10A:
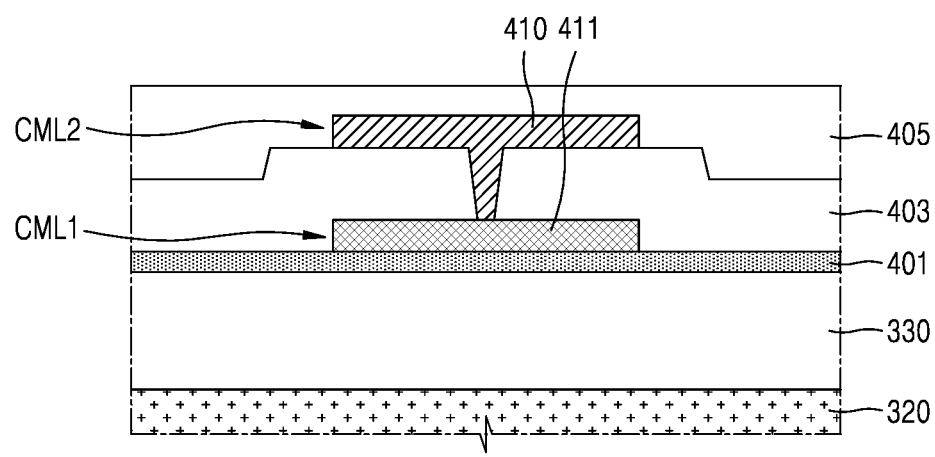
FIGS. 10A to 10D are enlarged cross-sectional views illustrating a region X of FIG. 9.

It is shown in FIGS. 9 and 10A that the first conductive layer, for example, the first connection electrode 411 of the first conductive layer is directly located on the first touch insulating layer 401. In this case, the first conductive layer, for example, the first connection electrode 411 of the first conductive layer may directly contact the first touch insulating layer 401.

Figure 10B:
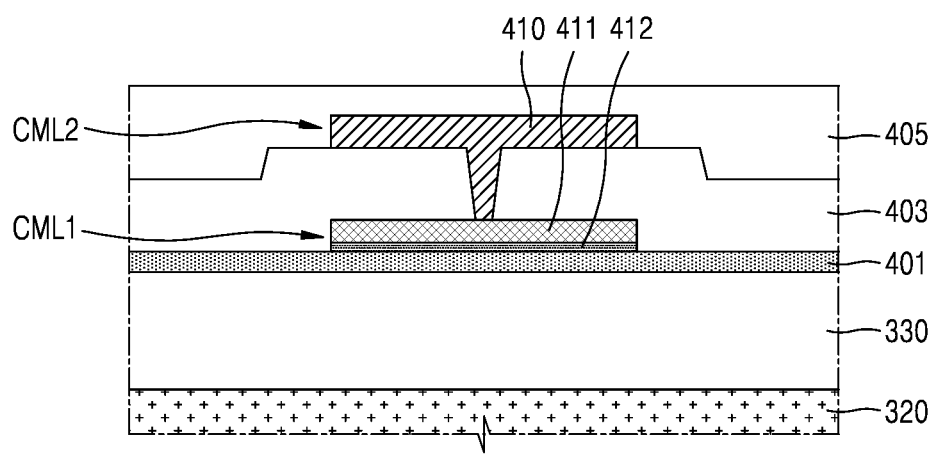
Figure 10C:
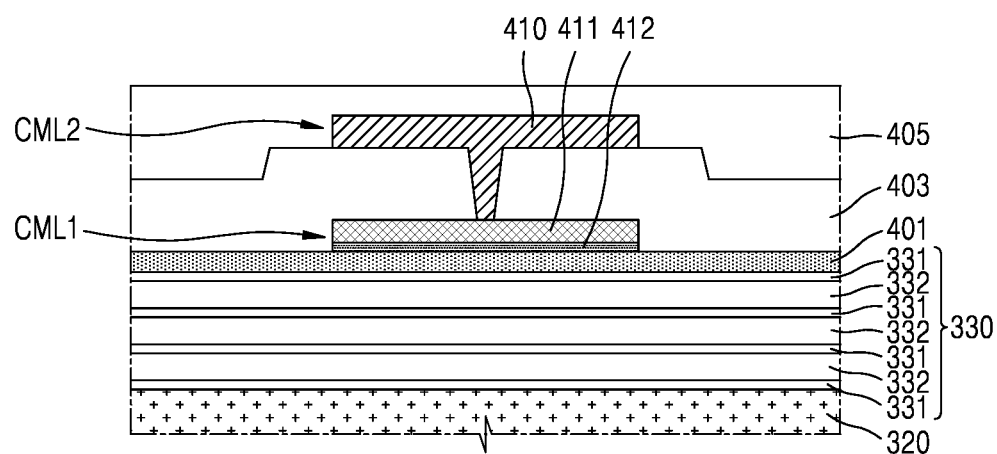

For example, as shown in FIG. 10B, an auxiliary layer 412 may be arranged on the first conductive layer, for example, a bottom surface of the first connection electrode 411 of the first conductive layer. In the case where the first touch insulating layer 401 includes silicon oxycarbide ($SiOC_y$), adhesive force between the first touch insulating layer 401 and the first conductive layer (for example, the first connection electrode 411 of the first conductive layer) may be strengthened by the auxiliary layer 412.

The auxiliary layer 412 is not entirely formed on the first touch insulating layer 401 and may have the same shape as the first conductive layer including the first connection electrode 411. In this regard, the FIG. 10 shows that the auxiliary layer 412 and the first connection electrode 411 have substantially the same shape or same pattern. Having the same shape or pattern means that a shape on a plane is the same and includes the case where a width is the same or the case where widths are different depending on a difference in an etched amount during a process. The auxiliary layer 412 may include, for example, an inorganic insulating layer such as a silicon nitride layer.

In an embodiment of the present disclosure, the second touch insulating layer 403 may include a resin material as shown in FIG. 10C. For example, the second touch insulating layer 403 may include a single layer including an acryl-based material. The second touch insulating layer 403 may include an acryl-based material formed at low temperature (e.g. 100° C. or less).

Figure 10D:
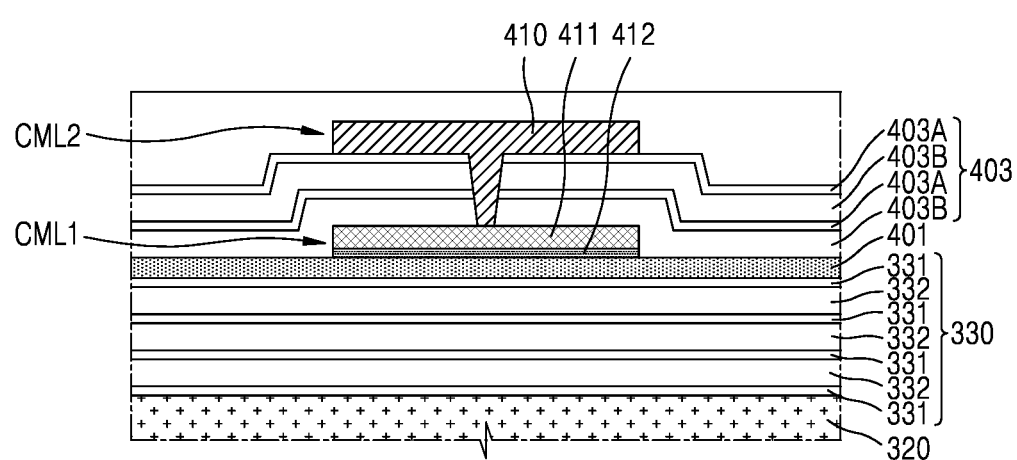

For example, as shown in FIG. 10D, the second touch insulating layer 403 may include a silicon carbon compound material, for example, silicon oxycarbide ($SiOC_y$) or silicon oxide ($SiO_xC_yH_z$) containing carbon and hydrogen.

For example, the second touch insulating layer 403 may include an inorganic insulating layer (a third layer 403A, hereinafter) and a fourth layer 403B, the third layer 403A including silicon, and the fourth layer 403B including a silicon carbon compound material.

The third layer 403A may include an inorganic insulating material, for example, an inorganic insulating material including silicon. The inorganic insulating material including silicon may include silicon nitride ($SiN_x$), silicon oxide ($SiO_x$), and/or silicon oxynitride (SiON).

The fourth layer 403B may include a silicon carbon compound material, for example, silicon oxycarbide ($SiOC_y$) or silicon oxide ($SiO_xC_yH_z$) containing carbon and hydrogen. As described above, the silicon carbon compound material may have characteristics similar to those of an organic material.

The second touch insulating layer 403 may have a structure in which the third layer 403A and the fourth layer 403B are alternately stacked. The thickness of the third layer 403A may be less than the thickness of the fourth layer 403B.

The third touch insulating layer 405 may include an organic insulating material (e.g. a resin material). For example, the third touch insulating layer 405 may include a single layer including an acryl-based material. The third touch insulating layer 405 may include an acryl-based material formed at low temperature (e.g. 100° C. or less).

As described with reference to FIGS. 9 to 10D, in the case where the first encapsulation layer 310, the third encapsulation layer 330, the first touch insulating layer 401, and/or the second touch insulating layer 403 include a silicon carbon compound material, the cracking issue caused by bending stress may be prevented compared to the case where the first encapsulation layer 310, the third encapsulation layer 330, the first touch insulating layer 401, and/or the second touch insulating layer 403 include only an inorganic insulating material.

Next, the peripheral area PA of FIG. 9 is described. FIG. 9 shows a second peripheral area PAS2 including the bent area PAB of the peripheral area PA.

At least one inorganic insulating layer 208 arranged over the substrate 100 may include an opening 2080P corresponding to the bent area PAB. The at least one inorganic insulating layer 208 may include the buffer layer 201, the gate insulating layer 203, the first interlayer insulating layer 205, and/or the second interlayer insulating layer 207. In an embodiment of the present disclosure, an opening 201a of the buffer layer 201, an opening 203a of the gate insulating layer 203, an opening 205a of the first interlayer insulating layer 205, and an opening 207a of the second interlayer insulating layer 207 may at least partially overlap one another to constitute the opening 2080P. A width OW of the opening 2080P may be greater than a width of the bent area PAB.

An organic insulating layer 215 may be formed in the bent area PAB. The organic insulating layer 215 may at least partially fill the opening 2080P of the inorganic insulating layer 208. The organic insulating layer 215 may be formed only in the bent area PAB. The organic insulating layer 215 may include an organic insulating material such as benzocyclobutene (BCB), polyimide, or hexamethyldisiloxane (HMDSO).

Because the at least one inorganic insulating layer 208 includes the opening 2080P in the bent area PAB, the occurrence of cracks in the at least one inorganic insulating layer 208 caused by bending stress may be prevented or minimized. Because the organic insulating layer 215 may be arranged in the opening 2080P and may absorb stress that occurs while bending occurs, the cracking issue may be prevented.

The thin-film encapsulation layer 300 may cover a portion of the peripheral area PA. A partition wall may be arranged in the peripheral area PA, the partition wall surrounding the display area DA. For example, it is shown in FIG. 9 that a first partition wall PW1 and a second partition wall PW2 are between the display area DA and the bent area PAB. The first partition wall PW1 may have a stacked structure including a plurality of partition wall layers. For example, the first partition wall PW1 may include a first partition wall layer PL1 and a second partition wall layer PL2. The first partition wall layer PL1 and the second partition wall layer PL2 may respectively include the same materials as the pixel-defining layer 211 and the planarization insulating layer 209. Like the first partition wall PW1, the second partition wall PW2 may include a stacked structure of a plurality of partition wall layers.

The first encapsulation layer 310 and the third encapsulation layer 330 of the thin-film encapsulation layer 300 may extend toward the bent area PAB beyond the first partition wall PW1 and the second partition wall PW2. The first encapsulation layer 310 and the third encapsulation layer 330 might not pass across the bent area PAB. For example, it is shown in FIG. 9 that a first edge 300E1 of the thin-film encapsulation layer 300 is disposed between the display area DA and the bent area PAB, for example, an edge of the first encapsulation layer 310 and an edge of the third encapsulation layer 330 are disposed between the display area DA and the bent area PAB. The second encapsulation layer 320 of the thin-film encapsulation layer 300 may be located on one side of a partition wall, for example, one side of the first partition wall PW1, and the first encapsulation layer 310 may contact the third encapsulation layer 330 in a region that neighbors the first edge 300E1 of the thin-film encapsulation layer 300.

Figure 11A:
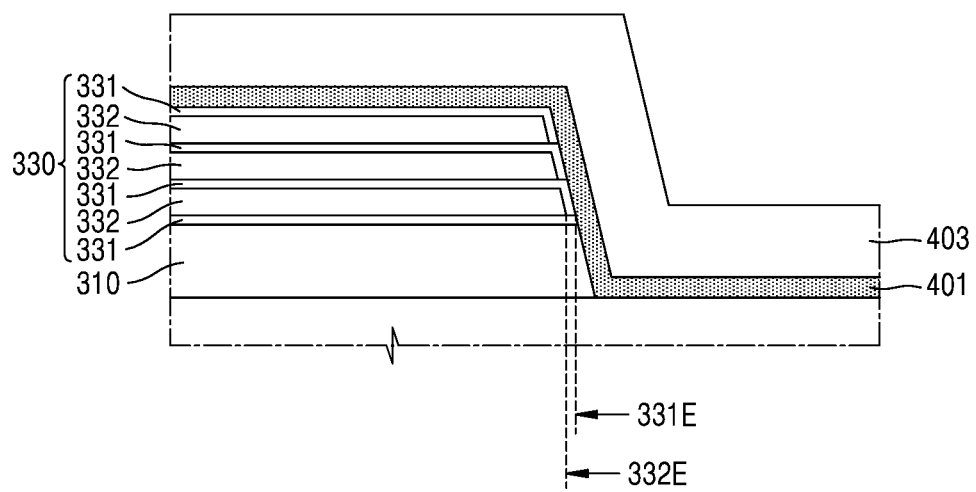
FIGS. 11A to 11D are enlarged cross-sectional views illustrating a region XI of FIG. 9.

Referring to FIG. 11A, the first encapsulation layer 310 may have a structure different from that of the third encapsulation layer 330. For example, the first encapsulation layer 310 may include an inorganic insulating material, for example, an inorganic insulating material including silicon. For example, the first encapsulation layer 310 may include silicon nitride ($SiN_x$), silicon oxide ($SiO_y$), and/or silicon oxynitride (SiON), and have a single-layered structure or a multi-layered structure including the above materials. An edge portion of the first encapsulation layer 310 may contact an edge portion of the third encapsulation layer 330.

As described with reference to FIGS. 10C and 10D, the third encapsulation layer 330 may include the first layer 331 and the second layer 332, the first layer 331 including an inorganic material, and the second layer 332 including a silicon carbon compound material. A specific structure thereof is the same as that described above.

In FIG. 11A, though the second layer 332, which is a lowermost layer of the third encapsulation layer 330, may directly contact the first encapsulation layer 310, a lowermost layer of the third encapsulation layer 330 may include the first layer 331, and the first layer 331 may directly contact the first encapsulation layer 310.

The first layer 331 and the second layer 332 may be formed by using the same mask. For example, the first layer 331 and the second layer 332 may be formed while the mask reciprocates in the same chamber. Though the first layer 331 and the second layer 332 are formed by using the same mask, an edge of the second layer 332 and an edge of the first layer 331 may be located on different positions in an edge portion of the third encapsulation layer 330 by a diffusion rate of a layer-forming gas during a process. For example, as shown in FIG. 11A, an edge 331E of the first layer 331 may extend further toward the peripheral area PA beyond an edge 332E of the second layer 332. Edges 3311E of the first layers 331 arranged on and under the second layer 332 with the second layer 332 therebetween may contact each other.

The first touch insulating layer 401 may be located on the third encapsulation layer 330, and as shown in FIGS. 9 and 11A, the first touch insulating layer 401 may extend toward an edge of the peripheral area PA beyond the first edge 300E1 of the thin-film encapsulation layer 300, for example, edges of the first and third encapsulation layers 310 and 330. The first touch insulating layer 401 may cover a top surface and a lateral surface of the third encapsulation layer 330, and a lateral surface of the first encapsulation layer 310. The first touch insulating layer 401 may include a silicon carbon compound material, and the second touch insulating layer 403 may include an organic insulating material, for example, a resin material including an acryl-based material.

Figure 11B:
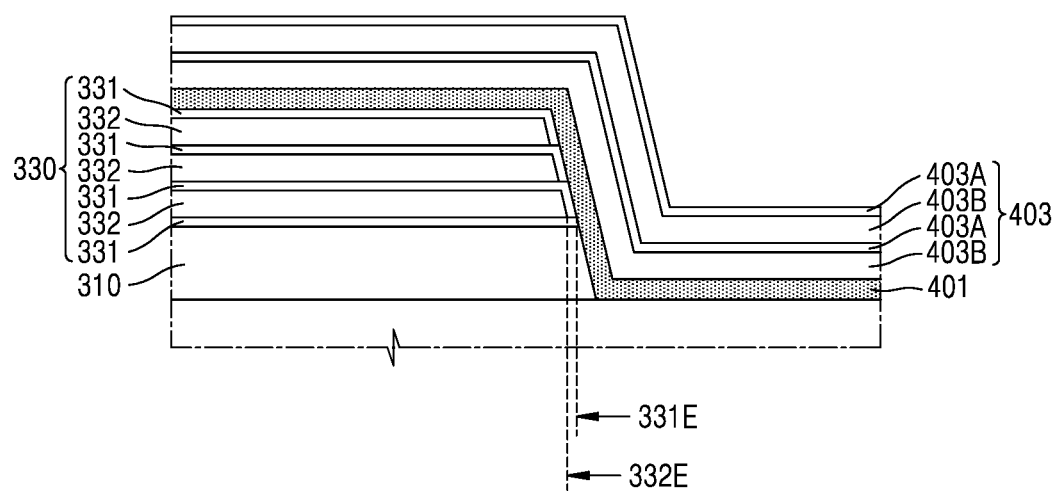

Though it is shown in FIG. 11A that the second touch insulating layer 403 includes an organic insulating material, the second touch insulating layer 403 may include a silicon carbon compound material such as silicon oxycarbide ($SiOC_y$) as shown in FIG. 11B. For example, the second touch insulating layer 403 has a stacked structure of the third layer 403A and the fourth layer 403B as described above with reference to FIG. 10D, the third layer 403A including an inorganic insulating material, and the fourth layer 403B including a silicon carbon compound material.

Figure 11C:
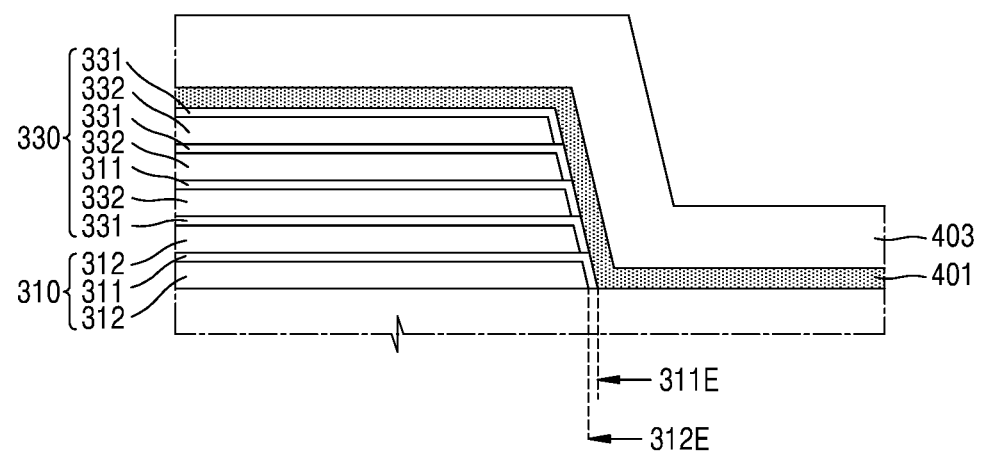

Though it is shown in FIGS. 11A and 11B that the first encapsulation layer 310 includes an inorganic insulating material, referring to FIG. 11C, the first encapsulation layer 310 may have a structure similar to that of the third encapsulation layer 330.

Figure 11D:
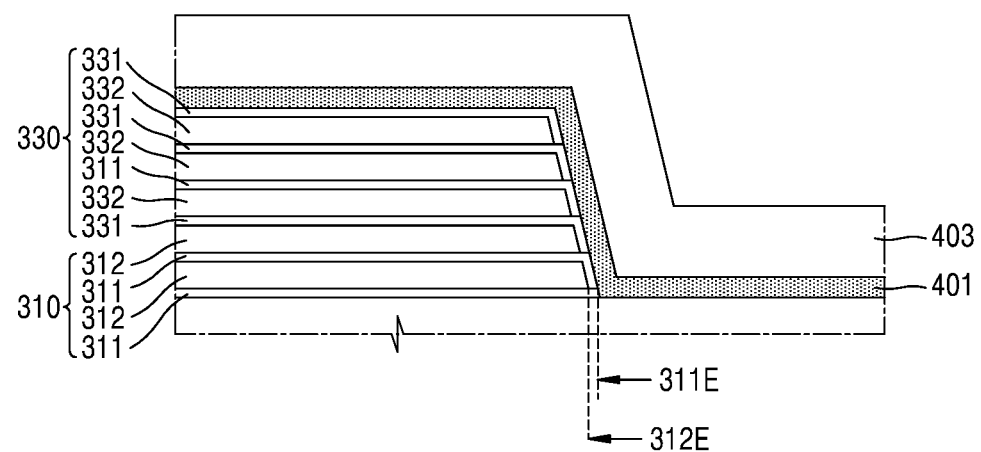

The first encapsulation layer 310 may include a silicon carbon compound material as shown in FIGS. 11C and 11D. For example, the first encapsulation layer 310 may a fifth layer 311 and a sixth layer 312, the fifth layer 311 including an inorganic insulating material, and the sixth layer 312 including a silicon carbon compound material.

The fifth layer 311 may include an inorganic insulating material, for example, an inorganic insulating material including silicon. The inorganic insulating material including silicon may include silicon nitride ($SiN_x$), silicon oxide ($SiO_x$), and/or silicon oxynitride (SiON).

The second layer 332 may include a silicon carbon compound material, and the silicon carbon compound material may include a silicon carbon ternary compound material or a silicon carbon quaternary compound material. The silicon carbon ternary compound material may include silicon oxycarbide ($SiOC_y$), and the silicon carbon quaternary compound material may include silicon oxide ($SiO_xC_yH_z$) containing carbon and hydrogen. The silicon carbon compound material may have characteristics similar to those of an organic material.

The first encapsulation layer 310 may have a structure in which the fifth layer 311 and the sixth layer 312 are alternately stacked. Similar to that described with reference to FIG. 11A, an edge 311E of the fifth layer 311 may extend further toward the peripheral area PA beyond an edge 312E of the sixth layer 312. In the case where one fifth layer 311 and one sixth layer 312 of the first encapsulation layer 310 correspond to 1 dyad, the first encapsulation layer 310 may have the number of stacked layers different from that of the third encapsulation layer 330. Alternatively, the first encapsulation layer 310 may have the same number of stacked layers as that of the third encapsulation layer 330. For example, the first encapsulation layer 310 may have a stacked structure of 3 dyads or more, and more preferably, 3.5 dyads or more.

As shown in FIG. 11C, the sixth layer 312 may be located in a lowermost layer of the first encapsulation layer 310, or as shown in FIG. 11D, the fifth layer 311 may be located in a lowermost layer of the first encapsulation layer 310.

Referring to the peripheral area PA of FIG. 9 again, at least one insulating layer of the touch sensing layer 400, for example, the first touch insulating layer 401 and/or the second touch insulating layer 403 may extend to pass across the bent area PAB and cover the bent area PAB.

Around the bent area PAB, the inner portion 431 of a trace line and the outer portion 432 of the trace line may be respectively arranged on two opposite sides of the bent area PAB. The connection portion 433 may extend to pass across the bent area PAB, the connection portion 433 connecting the inner portion 431 to the outer portion 432 of the trace line.

The inner portion 431 of the trace line shown in FIG. 9 may include a portion of the trace line and have the same structure as the trace line. For example, similar to the trace line 430 (see FIG. 7) including the first sub-trace layer 430A and the second sub-trace layer 430B that are described with reference to FIG. 7, the inner portion 431 of the trace line may include a first sub-layer 431A and a second sub-layer 431B. The first sub-layer 431A and the second sub-layer 431B shown in FIG. 9 may respectively include portions of the first sub-trace layer 430A and the second sub-trace layer 430B described with reference to FIG. 7.

In an embodiment of the present disclosure, the inner portion 431 of the trace line may include one of the first sub-layer 431A and the second sub-layer 431B. The trace line 430 (see FIG. 7) may include the first sub-trace layer 430A and the second sub-trace layer 430B, and one of the first sub-trace layer 430A and the second sub-trace layer 430B may extend further toward the bent area PAB than the other. One of the first sub-trace layer 430A and the second sub-trace layer 430B that extends further toward the bent area PAB may constitute the inner portion 431.

The inner portion 431 of the trace line may be connected to the connection portion 433 through a contact hole passing through insulating layers between the connection portion 433 and the inner portion 431, for example, a contact hole passing through the first touch insulating layer 401 and the second touch insulating layer 403. In an embodiment of the present disclosure, in the case where the inner portion 431 includes the first sub-layer 431A and the second sub-layer 431B, the second sub-layer 4311B may be connected to the first sub-layer 431A through a contact hole of the second touch insulating layer 403, and the first sub-layer 431A may be connected to the connection portion 433 through a contact hole of the first touch insulating layer 401. For example, the inner portion 431 may include one of the first sub-layer 431A and the second sub-layer 431B, for example, include the second sub-layer 431B. In this case, the second sub-layer 431B may be connected to the connection portion 433 through a contact hole passing through the first touch insulating layer 401 and the second touch insulating layer 403.

The connection portion 433 may be connected to the outer portion 432 through a contact hole passing through an insulating layer disposed between the outer portion 432 and the connection portion 433, for example, through the second interlayer insulating layer 207. Though it is shown in FIG. 9 that the outer portion 432 is located on the same layer as the second electrode CE2 of the storage capacitor Cst and includes the same material as the second electrode CE2, the outer portion 432 may be located on the same layer as the first electrode CE1 of the storage capacitor Cst or the first and second gate electrodes G1 and G2 and may include the same material as the first electrode CE1 of the storage capacitor Cst or the first and second gate electrodes G1 and G2.

The connection portion 433 may include a flexible conductive material, for example, aluminum compared to the inner portion 431 and the outer portion 432. For example, the connection portion 433 may include the same material as the data line DL and/or the drain electrode SD (or the source electrode) of the display area DA. In an embodiment of the present disclosure, the connection portion 433 may have a three-layered structure of a titanium layer/an aluminum layer/a titanium layer.

An organic insulating material layer may be further arranged between the connection portion 433 and the first touch insulating layer 401 and/or on the second touch insulating layer 403, the organic insulating material layer including a polymer. The organic insulating material layer may adjust a neutral surface of the display device.

Figure 12:
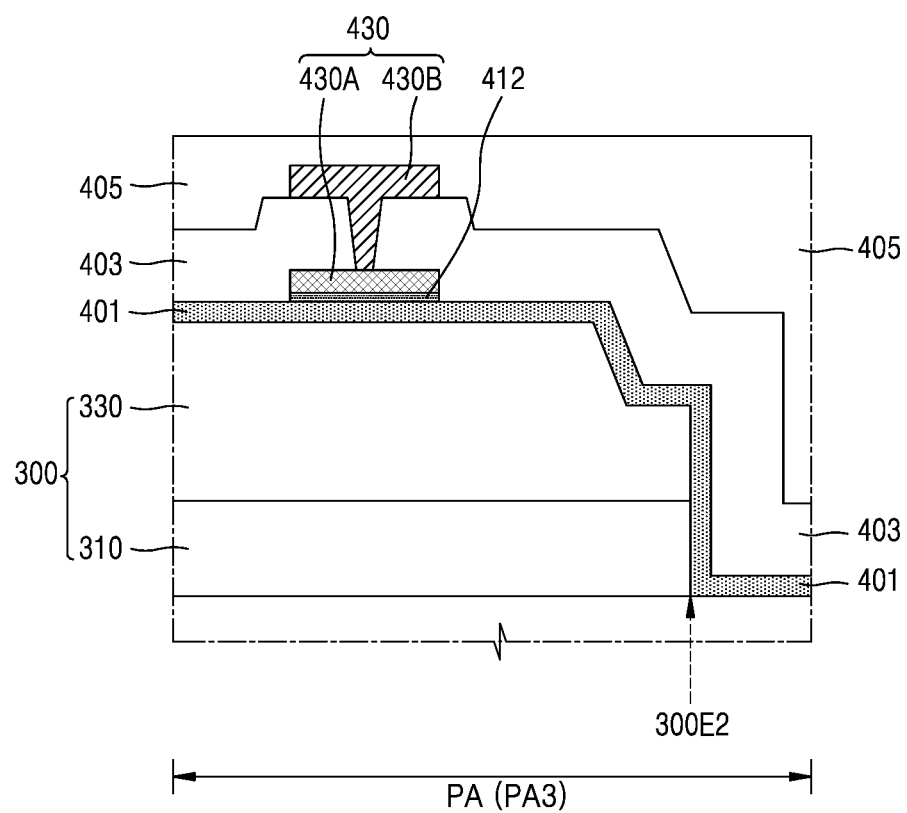
FIG. 12 is a view of a cross-section illustrating a trace line passing across a peripheral area in a display device according to an embodiment of the present disclosure.

FIG. 12 is a view illustrating a cross-section of a trace line passing across the peripheral area PA in the display device 1 according to an embodiment of the present disclosure.

Referring to FIG. 12, the trace line 430 may be located on the thin-film encapsulation layer 300 in a portion of the peripheral area PA, for example, the third peripheral area PAS3. The first sub-trace layer 430A of the trace line 430 may be connected to the second sub-trace layer 430B of the trace line 430 through a second contact hole CNT2 formed in the second touch insulating layer 403. The auxiliary layer 412 may be arranged under the first sub-trace line 430A.

As described above, in the case where the first touch insulating layer 401 includes a silicon oxycarbide layer (SiOC$_y$), the auxiliary layer 412 is arranged between the first conductive layer and the first touch insulating layer 401, and accordingly adhesive force between the first conductive layer, for example, the first connection electrode 411 and the first touch insulating layer 401 may be strengthened. The auxiliary layer 412 need not be entirely formed on the first touch insulating layer 401 and may be patterned to correspond to a bottom surface of the first sub-trace layer 430A. The auxiliary layer 412 may include an inorganic insulating layer, for example, such as a silicon nitride layer.

The trace line 430 may at least partially overlap the thin-film encapsulation layer 300, for example, the first to third encapsulation layers 310, 320, and 330. The first encapsulation layer 310 and the third encapsulation layer 330 may have the structure described above with reference to FIGS. 11A to 11D. The specific structure may be the same as that described above. The trace lines 430 may be covered by the third touch insulating layer 405.

Touch insulating layers of the touch sensing layer 400, for example, one or more of the first to third touch insulating layers 401, 403, and 405 may extend toward the edge of the display device 1 beyond a second edge 300E2 of the thin-film encapsulation layer 300.

Though FIG. 12 shows a structure in the third peripheral area PAS3 of the peripheral area PA, the first peripheral area PAS1 (see FIG. 2) and/or the fourth peripheral area PAS4 (see FIG. 2) may have a structure that is at least similar to that as shown in FIG. 12.

Figure 13:
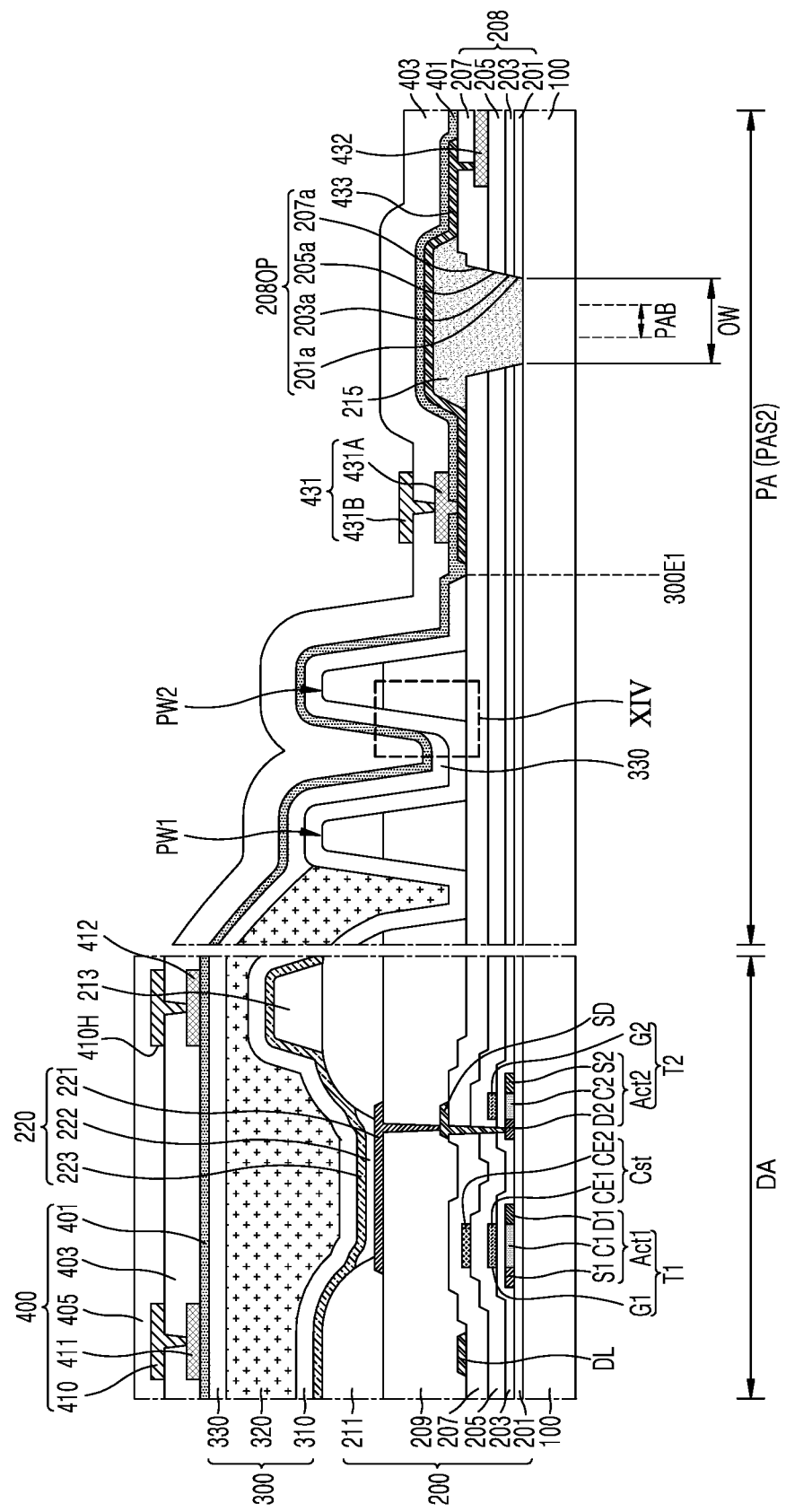
FIG. 13 is a cross-sectional view illustrating a display device according to an embodiment of the present disclosure.
Figure 14:
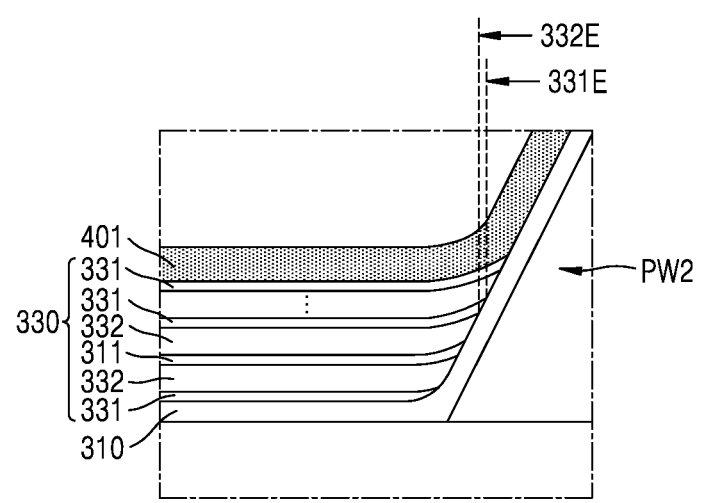
FIG. 14 is an enlarged view illustrating a region XIV of FIG. 13.

FIG. 13 is a cross-sectional view illustrating the display device 1 according to an embodiment of the present disclosure, and FIG. 14 is an enlarged view illustrating a region XIV of FIG. 13.

Characteristics including a structure of the display area DA and a connection structure around the bent area PAB in the peripheral area PA of FIG. 13 are the same as those described above with reference to FIGS. 9 to 12. FIG. 13 is different from FIG. 9 in the structure of the thin-film encapsulation layer 300 in the peripheral area PA. Like reference numerals are given to like elements, and differences are mainly described below.

The first encapsulation layer 310 and the third encapsulation layer 330 of the thin-film encapsulation layer 300 may extend further toward the outer side than the second encapsulation layer 320. For example, it is shown in FIG. 13 that the edges of the first encapsulation layer 310 and the third encapsulation layer 330 extend further toward the bent area PAB beyond the edge of the second encapsulation layer 320.

The first encapsulation layer 310 may at least partially overlap and contact the third encapsulation layer 330 in the peripheral area PA, wherein one of the edges of the first encapsulation layer 310 and the third encapsulation layer 330 may be closer to the display area DA than the other edge. For example, the edge of the third encapsulation layer 330 may be disposed between the first partition wall PW1 and the second partition wall PW2, and the edge of the first encapsulation layer 310 may extend toward the outer side beyond the first partition wall PW1 and the second partition wall PW2.

As shown in FIG. 14, the third encapsulation layer 330 may have a structure in which the first layer 331 and the second layer 332 are alternately stacked, the first layer 331 including an inorganic insulating material, and the second layer 332 including a silicon carbon compound material.

The first encapsulation layer 310 may be arranged along a lateral surface of a partition wall, for example, the second partition wall PW2. The edge of the first layer 331 and the edge of the second layer 332 may contact the first encapsulation layer 310, the edge of the first layer 331 and the edge of the second layer 332 corresponding to the edges of the third encapsulation layer 330. The edge 331E of the first layer 331 may extend further beyond the edge 332E of the second layer 332 located thereunder and the first layer 331 may directly contact a top surface of the first encapsulation layer 310. In the case where the first encapsulation layer 310 includes an inorganic insulating material, the first layer 331 and the first encapsulation layer 310 may constitute a contact between inorganic insulating material layers.

Figure 15:
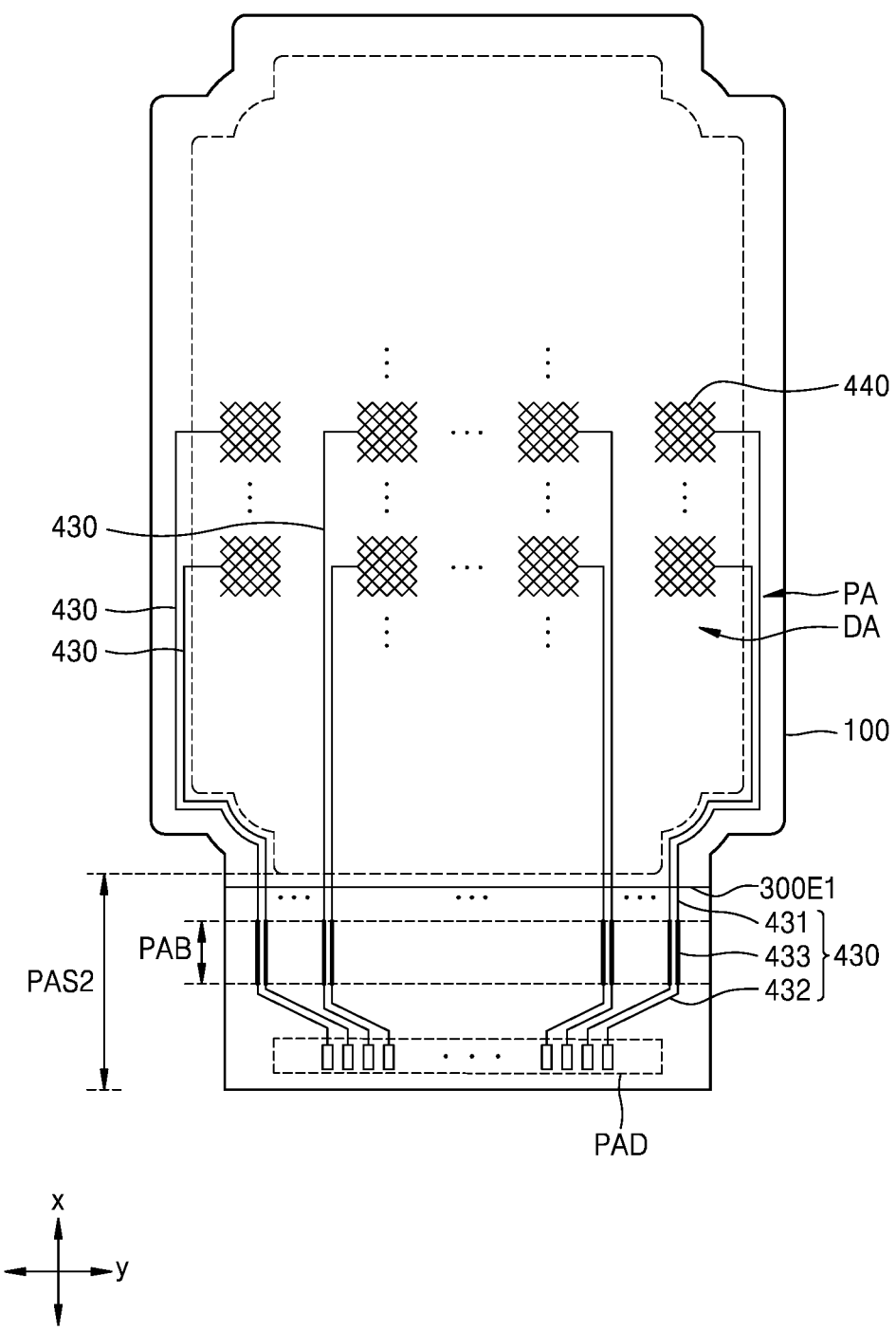
FIG. 15 is a plan view illustrating a display device according to an embodiment of the present disclosure.

FIG. 15 is a plan view illustrating the display device 1 according to an embodiment of the present disclosure.

Referring to FIG. 15, the display device 1 may include touch electrodes of an arrangement different from the touch electrodes of a touch input portion described with reference to FIG. 6, for example, the first and second touch electrodes 410 and 420. As shown in FIG. 15, touch electrodes 440 arranged in a matrix configuration may be arranged in the display area DA.

Each of the touch electrodes 440 may be connected to the trace line 430. Some of the trace lines 430 may pass across the display area DA. The trace lines 430 may extend across the bent area PAB in the second peripheral area PAS2. Each trace line 430 may include the inner portion 431, the outer portion 432, and the connection portion 433, the inner portion 431 and the outer portion 433 being spaced apart from each other with the bent area PAB disposed therebetween, and the connection portion 433 connecting the inner portion 431 to the outer portion 432. The connection portion 433 may include a conductive material that is more flexible than the inner portion 431 and the outer portion 432 and accordingly may prevent the trace lines 430 from being damaged by stress caused in the case where the bent area PAB is bent. The conductive material may be flexible and may include, for example, aluminum.

The touch electrodes 440 may have a mesh structure. As described above in the enlarged view illustrating FIG. 8B, each touch electrode 440 may have a mesh structure including a hole corresponding to an emission area of a pixel. The touch electrodes 440 may include metal, for example, molybdenum (Mo), aluminum (Al), copper (Cu), and/or titanium (Ti) and include a single layer or a multi-layer including the above materials. In an embodiment of the present disclosure, the touch electrodes 440 each may have a structure in which a titanium layer, an aluminum layer, and a titanium layer are sequentially stacked (Ti/Al/Ti).

Each touch electrode 440 may be provided as one body with the trace line 430. For example, the touch input portion described with reference to FIG. 6 may include the first and second conductive layers CML1 and CML2 (see FIG. 7). In contrast, the touch input portion shown in FIG. 15 may include a single conductive layer. Therefore, the touch electrodes 440 and the trace lines 430 may include the same material.

Figure 16:
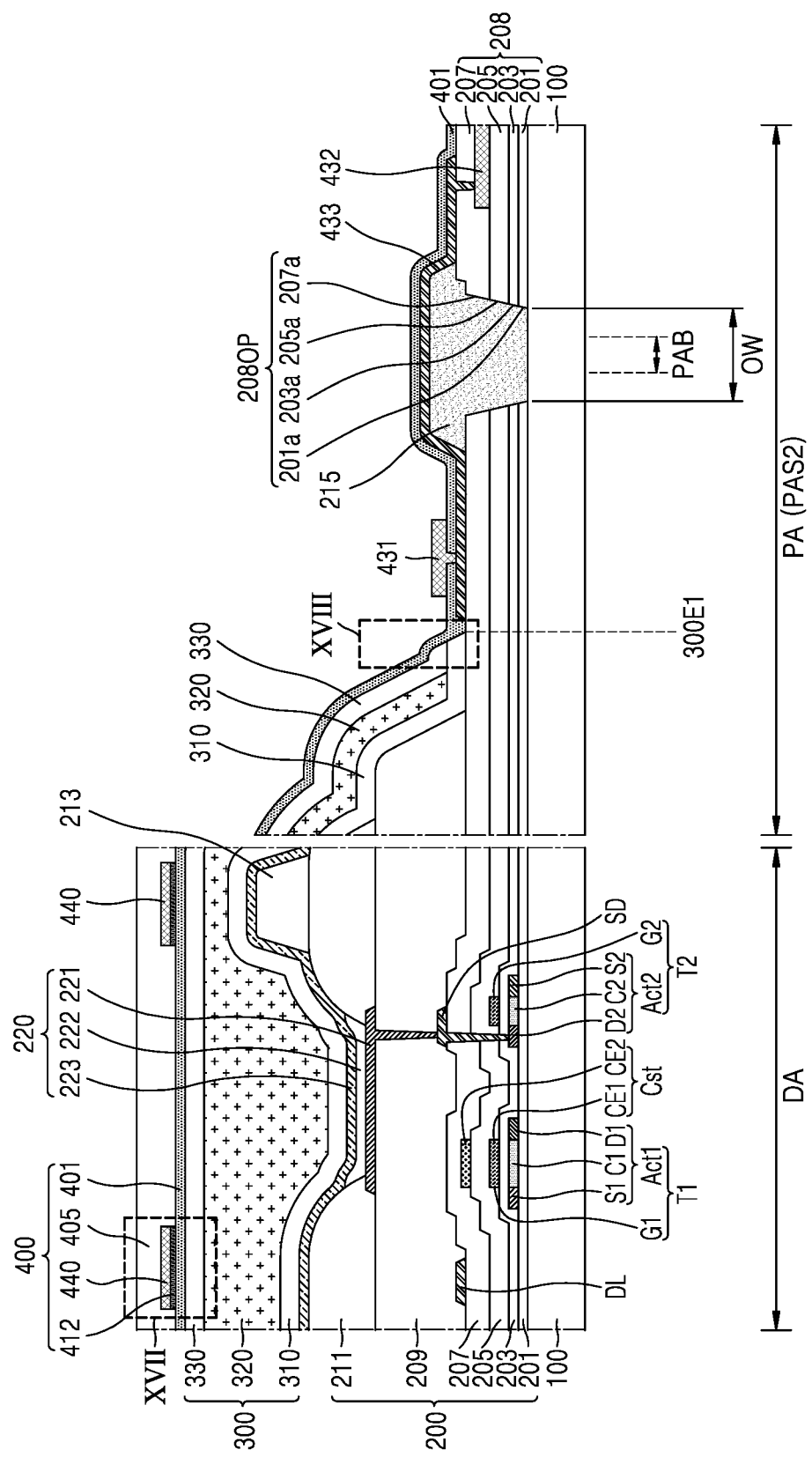
FIG. 16 is a cross-sectional view illustrating a display device according to an embodiment of the present disclosure.
Figure 17:
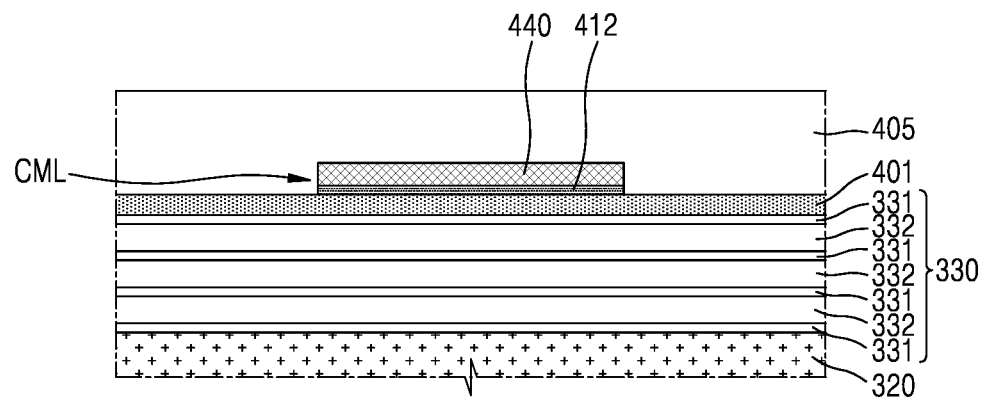
FIG. 17 is an enlarged view illustrating a region XVII of FIG. 16.

FIG. 16 is a cross-sectional view illustrating the display device 1 according to an embodiment of the present disclosure, FIG. 17 is an enlarged view illustrating a region XVII of FIG. 16, and FIGS. 18A to 18C are enlarged views of a region XVIII of FIG. 16.

First, referring to the display area DA of FIG. 16, the display layer 200 is arranged on the substrate 100, and the thin-film encapsulation layer 300 is arranged on the display layer 200. Specific configurations of the substrate 100, the display layer 200, and the thin-film encapsulation layer 300 may be the same as those described above with reference to FIG. 9. For example, as shown in FIG. 17, the third encapsulation layer 330 arranged on the second encapsulation layer 320 including a polymer may include the first layer 331 and the second layer 332, the first layer 331 including an inorganic insulating material, and the second layer 332 including a silicon carbon compound material. A specific structure thereof is the same as that described above.

Referring to FIG. 17 and the display area DA of FIG. 16, the touch sensing layer 400 may include the touch electrode 440 and the third touch insulating layer 405, the touch electrode 440 being disposed on the first touch insulating layer 401, and the third touch insulating layer 405 covering the touch electrode 440. Though the touch electrode 440 is shown as a portion of the conductive layer CML in FIG. 15, the trace line 430 may also include an element of the conductive layer CML and be located on the same layer (e.g. the first touch insulating layer) as the touch electrode 440.

The first touch insulating layer 401 may include a silicon carbon compound material. For example, the first touch insulating layer 401 may include silicon oxycarbide ($SiOC_y$) or silicon oxide ($SiO_xC_yH_z$) containing carbon and hydrogen. As described above, the silicon carbon compound material may have properties of an organic material. For example, the silicon carbon compound may be an organic layer.

The auxiliary layer 412 may be arranged on a conductive layer, for example, a bottom surface of the touch electrode 440 of the conductive layer. In the case where the first touch insulating layer 401 includes silicon oxycarbide ($SiOC_y$), adhesive force between the first touch insulating layer 401 and the conductive layer formed thereon, for example, the touch electrode 440 of the conductive layer may be strengthened. The auxiliary layer 412 may be also arranged on a bottom surface of the trace line 430. The auxiliary layer 412 is not entirely formed on the first touch insulating layer 401 and may be formed on only a bottom surface of the first connection electrode 411 and the trace line 430. The auxiliary layer 412 may include an inorganic insulating layer, for example, a silicon nitride layer. For example, the auxiliary layer 412 may be omitted.

Next, referring to the peripheral area PA of FIG. 16, at least one inorganic insulating layer 208 including the opening 2080P is arranged in the peripheral area PA, the opening 2080P corresponding to the bent area PAB. The opening 2080P may include the opening 201a of the buffer layer 201, the opening 203a of the gate insulating layer 203, the opening 205a of the first interlayer insulating layer 205, and/or the opening 207a of the second interlayer insulating layer 207. A width OW of the opening 2080P may be greater than the width of the bent area PAB as described above.

The organic insulating layer 215 may be formed in the bent area PAB. The organic insulating layer 215 may at least partially fill the opening 2080P of at least one inorganic insulating layer 208. The organic insulating layer 215 may include an organic insulating material such as benzocyclobutene (BCB), polyimide, or hexamethyldisiloxane (HMDSO).

The thin-film encapsulation layer 300 may cover a portion of the peripheral area PA. For example, it is shown in FIG. 16 that the first edge 300E1 of the thin-film encapsulation layer 300 is between the display area DA and the bent area PAB. The second encapsulation layer 320 of the thin-film encapsulation layer 300 may be arranged on one side of a partition wall, for example, the first partition wall PW1. The first encapsulation layer 310 and the third encapsulation layer 330 may extend toward the outer side beyond at least one of the first partition wall PW1 and the second partition wall PW2. The first encapsulation layer 310 may contact the third encapsulation layer 330 in a region neighboring the first edge 300E1 of the thin-film encapsulation layer 300. Though it is shown in FIG. 16 that the first and third encapsulation layers 310 and 330 and the first and second partition walls PW1 and PW2 have substantially the same structures as those described above with reference to FIG. 9, the structures of the first and third encapsulation layers 310 and 330 and the first and second partition walls PW1 and PW2 described above with reference to FIGS. 13 and 14 may be located in the peripheral area PA of FIG. 16.

Figure 18A:
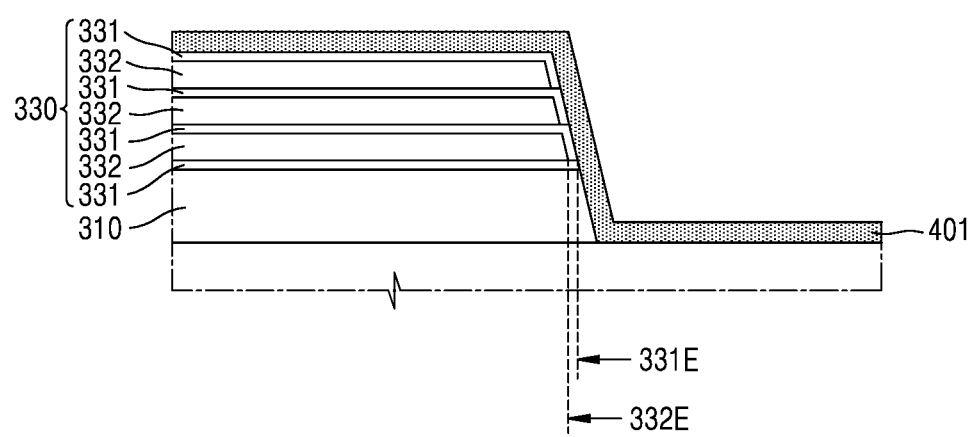
FIGS. 18A to 18C are enlarged views illustrating a region XVIII of FIG. 16.

Referring to FIG. 18A, the first encapsulation layer 310 may include an inorganic insulating material, for example, an inorganic insulating material including silicon. For example, the first encapsulation layer 310 may include silicon nitride ($SiN_x$), silicon oxide ($SiO_x$), and/or silicon oxynitride (SiON).

The third encapsulation layer 330 may include the first layer 331 and the second layer 332, the first layer 331 including an inorganic insulating material such as silicon nitride ($SiN_x$) and silicon oxide ($SiO_x$), and the second layer including a silicon carbon compound material such as silicon oxycarbide ($SiOC_y$). In an embodiment of the present disclosure, the third encapsulation layer 330 may have a structure in which the first layer 331 and the second layer 332 are alternately stacked as described above with reference to FIGS. 11A to 11C.

Figure 18B:
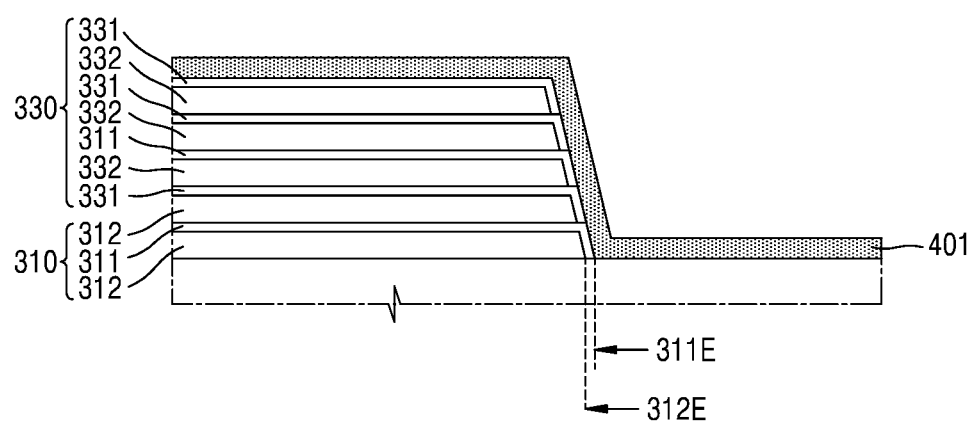
Figure 18C:
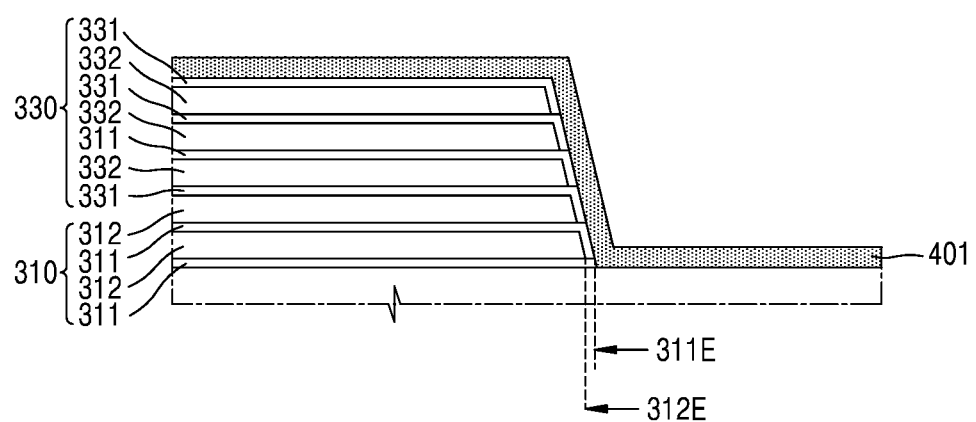

Referring to FIGS. 18B and 18C, like the third encapsulation layer 330, the first encapsulation layer 310 may include the fifth layer 311 and the sixth layer 312, the fifth layer 311 including an inorganic insulating material, and the sixth layer 312 including a silicon carbon compound material. For example, the first encapsulation layer 310 may have a structure in which the fifth layer 311 and the sixth layer 312 are alternately stacked. A lowermost layer of the first encapsulation layer 310 may include the fifth layer 311 (see FIG. 18C) or the sixth layer 312 (see FIG. 18B).

In the peripheral area PA, the first edge 300E1 of the thin-film encapsulation layer 300 may be covered by an insulating layer of the touch sensing layer 400, for example, the first touch insulating layer 401. Because the first touch insulating layer 401 including a silicon carbon compound material such as silicon oxycarbide ($SiOC_y$) may have properties of an organic layer, the first touch insulating layer 401 may extend to pass across the bent area PAB. The first touch insulating layer 401 may be arranged on the connection portion 433 and may cover the connection portion 433.

The inner portion 431 of the trace line shown in FIG. 16 includes a portion of the trace line 430 (see FIG. 15). The inner portion 431 of the trace line may be connected to the connection portion 433 through a contact hole passing through an insulating layer, for example, the first touch insulating layer 401 between the connection portion 433 and the inner portion 431. The connection portion 433 may be connected to the outer portion 432 through a contact hole passing through an insulating layer, for example, the second interlayer insulating layer 207 between the outer portion 432 and the connection portion 433. Though it is shown in FIG. 16 that the outer portion 432 is located on the same layer as the second electrode CE2 of the storage capacitor Cst and includes the same material as the second electrode CE2, the outer portion 432 may be located on the same layer as the first electrode CE of the storage capacitor Cst or the first and second gate electrodes G1 and G2 and may include the same material as the first electrode CE1 or the first and second gate electrodes G1 and G2.

The connection portion 433 may include a flexible conductive material, for example, aluminum compared to the inner portion 431 and the outer portion 432. For example, the connection portion 433 may include the same material as the data line DL and/or the drain electrode SD (or the source electrode) of the display area DA. In an embodiment of the present disclosure, the connection portion 433 may have a three-layered structure of a titanium layer/an aluminum layer/a titanium layer.

Though not shown in FIG. 16, an organic insulating material layer may be further arranged between the connection portion 433 and the first touch insulating layer 401 and/or on the second touch insulating layer 403, the organic insulating material layer including a polymer. The organic insulating material layer may adjust a neutral surface of the display device.

Because the thin-film encapsulation layer and/or the touch sensing layer arranged in the display area and bent together with the display area include a silicon carbon compound material, a display device which may prevent damage caused by bending stress and effectively accomplish moisture transmission prevention is provided. However, it should be understood that embodiments described herein should be considered in a descriptive sense only and not for limitation of the disclosure.

It should be understood that embodiments described herein should be considered in a descriptive sense and not necessarily limiting. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display device, comprising:
    a display area;
    a peripheral area at least partially surrounding the display area;
    a display layer including a plurality of display elements arranged in the display area;
    a thin-film encapsulation layer disposed on the display layer and including a first encapsulation layer, a second encapsulation layer disposed on the first encapsulation layer, and a third encapsulation layer disposed on the second encapsulation layer; and
    a touch sensing layer disposed on the thin-film encapsulation layer and including a plurality of touch electrodes and a plurality of trace lines,
    wherein the display area is at least partially bent about a bending axis,
    wherein the third encapsulation layer is bent along the bending axis of the display area and has a structure in which a first layer and a second layer are alternately stacked, the first layer including an inorganic insulating material, and the second layer including a silicon carbon ternary or quaternary compound material, and
    wherein the second layer including the silicon carbon ternary or quaternary compound material is thicker than the first layer including the inorganic insulating material.

2. The display device of claim 1, wherein the second layer includes silicon oxycarbide ($SiOC_y$) or silicon oxide ($Si-O_xC_yH_z$) containing carbon and hydrogen.

3. The display device of claim 2, wherein the first layer includes an inorganic insulating material including silicon.

4. The display device of claim 3, wherein the first layer includes silicon nitride, silicon oxide, or silicon oxynitride.

5. The display device of claim 1, wherein an edge of the first layer extends further toward the peripheral area than an edge of the second layer extends towards the peripheral area.

6. The display device of claim 1, wherein the touch sensing layer includes:
    a conductive layer including at least one of the plurality of touch electrodes or at least one of the plurality of trace lines;
    a first touch insulating layer disposed between the thin-film encapsulation layer and the conductive layer, and
    a second touch insulating layer at least partially covering the conductive layer and including an organic material.

7. The display device of claim 6, wherein the first touch insulating layer includes an organic insulating material or a silicon carbon compound material.

8. The display device of claim 7, further comprising an auxiliary layer arranged on a bottom surface of the conductive layer facing the first touch insulating layer, the auxiliary layer including an inorganic insulating material.

9. The display device of claim 6, wherein the touch sensing layer further includes:
    a second conductive layer disposed between the first touch insulating layer and the second touch insulating layer; and
    a third touch insulating layer disposed between the conductive layer and the second conductive layer.

10. The display device of claim 9, wherein the third touch insulating layer includes a layer including an inorganic insulating material and a layer including a silicon carbon compound material.

11. The display device of claim 10, wherein a thickness of the layer including the silicon carbon compound material is greater than a thickness of the layer including the inorganic insulating material.

12. The display device of claim 6, wherein the peripheral area includes a bent area, and
    the first touch insulating layer at least partially covers the bent area.

13. The display device of claim 12, wherein each of the plurality of trace lines includes an inner portion, an outer portion, and a connection portion, the inner portion and the outer portion being respectively arranged on two opposite sides of the bent area with the bent area disposed therebetween, and the connection portion being connected to both the inner portion and the outer portion through contact holes and connecting the inner portion to the outer portion.

14. The display device of claim 1, wherein the display area includes a main display area, a plurality of lateral display areas, and a plurality of edge display areas, the plurality of lateral display areas constituting an image surface that is different from the main display area, and the plurality of edge display areas connecting the main display area to the plurality of lateral display areas.

15. A display device, comprising:
    a display area;
    a peripheral area at least partially surrounding the display area;
    a display layer including a plurality of display elements disposed in the display area;

a thin-film encapsulation layer disposed on the display layer and including a first encapsulation layer, a second encapsulation layer disposed on the first encapsulation layer, and a third encapsulation layer disposed on the second encapsulation layer;

a touch sensing layer disposed on the thin-film encapsulation layer and including a conductive layer and a touch insulating layer, the conductive layer including a touch electrode or a trace line; and at least one partition wall disposed in the peripheral area, wherein the display area is at least partially bent about a bending axis, wherein the second encapsulation layer includes an organic material, an edge of the second encapsulation layer is adjacent to the at least one partition wall, wherein at least one of the first encapsulation layer, the third encapsulation layer, or the touch insulating layer includes a silicon carbon compound material and extends toward the peripheral area beyond the at least one partition wall, and wherein at least one of the first encapsulation layer or the third encapsulation layer has a structure in which a first layer and a second layer are alternately stacked, the first layer including an inorganic insulating material that includes silicon but does not include carbon, and the second layer including a silicon carbon compound material.

16. The display device of claim 15, wherein the second encapsulation layer includes an organic insulating material.

17. The display device of claim 16, wherein a thickness of the second layer is greater than a thickness of the first layer.

18. The display device of claim 16, wherein the first layer includes silicon nitride, silicon oxide, or silicon oxynitride, and wherein the second layer includes silicon oxycarbide (SiOCy) or silicon oxide (SiOxCyHz) containing carbon and hydrogen.

19. The display device of claim 16, wherein the peripheral area includes a bent area and a pad, the pad being spaced apart from the display area with the bent area of the peripheral area disposed therebetween, and wherein an edge of the thin-film encapsulation layer is disposed between the display area and the bent area of the peripheral area.

20. The display device of claim 19, wherein an edge of the first layer extends further toward the peripheral area than an edge of the second layer extends towards the peripheral area.

21. The display device of claim 15, wherein the touch insulating layer includes a first touch insulating layer and a second touch insulating layer, the second touch insulating layer being disposed on the first touch insulating layer and including an organic insulating material, and wherein the conductive layer is disposed between the first touch insulating layer and the second touch insulating layer.

22. The display device of claim 21, wherein the first touch insulating layer includes a silicon carbon compound material, and wherein the display device further includes: an auxiliary layer disposed on a bottom surface of the conductive layer facing the first touch insulating layer, the auxiliary layer contacting the first touch insulating layer and the conductive layer.

23. The display device of claim 22, wherein the auxiliary layer includes an inorganic insulating material.

24. The display device of claim 21, wherein the touch sensing layer further includes:

a second conductive layer disposed between the first touch insulating layer and the second touch insulating layer; and a third touch insulating layer disposed between the conductive layer and the second conductive layer.

25. The display device of claim 24, wherein at least one of the first touch insulating layer or the third touch insulating layer includes a silicon carbon compound material.

26. The display device of claim 25, wherein the third touch insulating layer includes a layer including an inorganic insulating material and a layer including a silicon carbon compound material.

27. The display device of claim 24, wherein the peripheral area includes a bent area, and wherein at least one of the first touch insulating layer or the second touch insulating layer extends to the bent area of the peripheral area.

28. The display device of claim 27, wherein each of the plurality of trace lines includes an inner portion, an outer portion, and a connection portion, the inner portion and the outer portion being respectively arranged on two opposite sides of the bent area with the bent area disposed therebetween, and the connection portion being connected to both the inner portion and the outer portion through contact holes and connecting the inner portion to the outer portion.

29. A display device, comprising:

a substrate including a display area and a peripheral area at least partially surrounding the display area, the display area of the substrate being bent about a bending axis;

a thin-film encapsulation layer disposed on the display area;

a touch sensing layer disposed on the thin-film encapsulation layer; and at least one partition wall disposed in the peripheral area, wherein the thin-film encapsulation layer is bent along the bending axis, wherein a sub-layer of the thin-film encapsulation layer includes a repeating pattern of a plurality of inorganic insulating material layers and a plurality of silicon carbon ternary or quaternary compound material layers and extends toward the peripheral area beyond the at least one partition wall, and wherein an edge of one of the plurality of inorganic insulating material layers extends further beyond an edge of one of the plurality of silicon carbon ternary or quaternary compound material layers located proximately below the one of the plurality of inorganic insulating material layers.

* * * * *